(12) United States Patent
Miyajima et al.

(10) Patent No.: US 6,275,604 B1
(45) Date of Patent: Aug. 14, 2001

(54) METHOD AND APPARATUS FOR GENERATING SEMICONDUCTOR EXPOSURE DATA

(75) Inventors: Masaaki Miyajima; Yoshio Ito, both of Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/132,461

(22) Filed: Aug. 12, 1998

(30) Foreign Application Priority Data

Mar. 16, 1998 (JP) .................................................. 10-065454

(51) Int. Cl.[7] ....................................................... G06K 9/00
(52) U.S. Cl. .......................... 382/146; 382/144; 382/173; 382/199; 382/203; 430/5; 430/313; 430/328; 430/333
(58) Field of Search ..................................... 382/144, 148, 382/145, 151, 269, 165, 174, 190, 199, 203, 219, 257, 266, 283, 298; 250/305, 306, 315.5, 396 R, 492.2, 491.1; 430/5, 313, 302, 328, 333; 356/335, 337

(56) References Cited

U.S. PATENT DOCUMENTS

| | | | |
|---|---|---|---|
| 4,532,598 | * 7/1985 | Shibayama et al. | 250/398 |
| 4,914,304 | * 4/1990 | Koyama | 250/492.2 |
| 5,036,209 | 7/1991 | Kataoka et al. | |
| 5,051,556 | * 9/1991 | Sakamoto et al. | 250/492.2 |
| 5,062,054 | * 10/1991 | Kawakami et al. | 716/11 |
| 5,095,447 | * 3/1992 | Manns et al. | 395/161 |
| 5,256,881 | * 10/1993 | Yamazaki et al. | 250/492.23 |
| 5,349,197 | * 9/1994 | Sakamoto et al. | 250/492.2 |
| 5,424,548 | * 6/1995 | Puisto | 250/491.1 |
| 5,466,549 | * 11/1995 | Yamada | 250/491.1 |
| 5,537,487 | * 7/1996 | Miyajima et al. | 382/144 |
| 5,792,581 | * 8/1998 | Ohnuma | 430/296 |
| 5,801,954 | * 9/1998 | Le et al. | 382/144 |
| 6,107,207 | * 8/2000 | Waas et al. | 438/707 |

FOREIGN PATENT DOCUMENTS 5-182899   7/1993   (JP) .

* cited by examiner

Primary Examiner—Matthew C. Bella
Assistant Examiner—Sheela Chawan
(74) Attorney, Agent, or Firm—Staas & Halsey LLP

(57) ABSTRACT

A computer implemented method and an apparatus for generating exposure data of a layout pattern used to fabricate semiconductor integrated circuits. The layout pattern is first analyzed to determine if it can be modified to one or more predefined patterns without having to segment the layout pattern into rectangular patterns. The layout pattern is then modified to the one or more predefined patterns. The modified pattern is also analyzed to determine if it can be modified into segmental block patterns and if so, it is modified accordingly. Finally, exposure data is generated using the modified segmental block patterns.

31 Claims, 28 Drawing Sheets

| | |
|---|---|
| Block number | 51a |
| Block Type (recursive block) | 51b |
| Coordinate x | 51c |
| Coordinate y | 51d |

Recursive block data ~51

| | |
|---|---|
| Block number | 52a |
| Block Type (segmental block) | 52b |
| Pattern shape | 52c |
| Coordinate x | 52d |
| Coordinate y | 52e |
| Pattern size | 52f |

Segmental block pattern data ~52

| | |
|---|---|
| Pattern shape | 53a |
| Coordinate x | 53b |
| Coordinate y | 53c |
| Pattern size | 53d |

Pattern data ~53

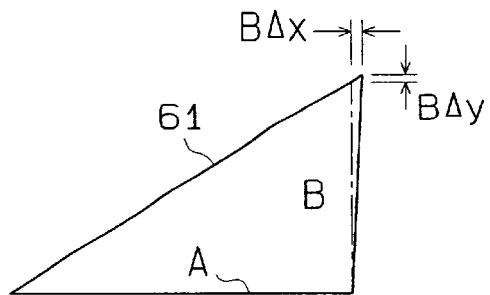
Fig.11A
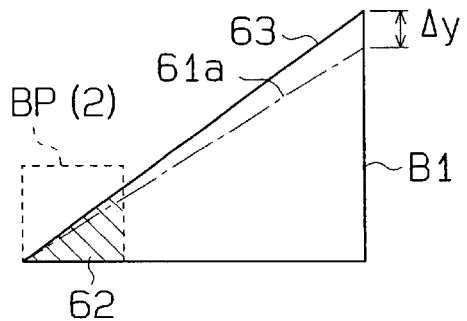
Fig.11B
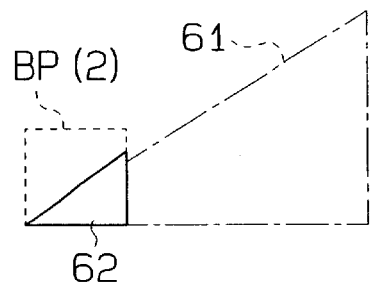
Fig.11C
Fig.12
| | |
|---|---|
| Block number = 2 | 64a |
| Block Type = segment | 64b |
| Pattern shape = triangle | 64c |
| Coordinate x | 64d |
| Coordinate y | 64e |
| Pattern size | 64f |

Fig.13A
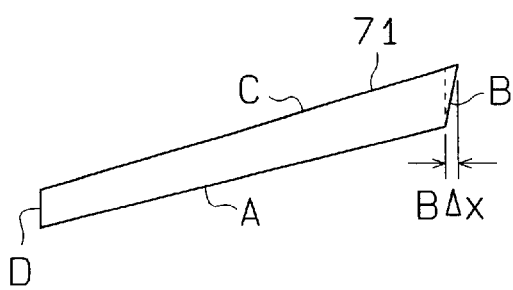
Fig.13B
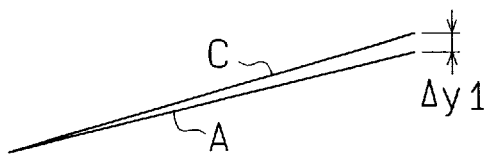
Fig.13C
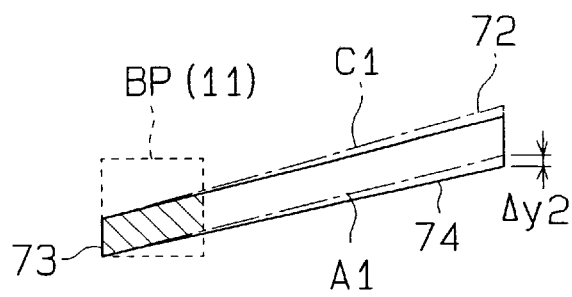
Fig.13D
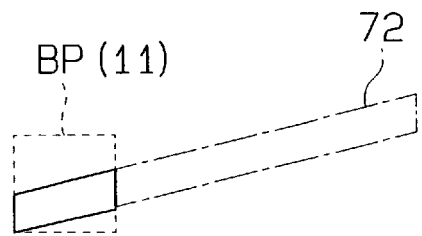
Fig.14
| Block number = 11 | 75a |
|---|---|
| Block Type = segment | 75b |
| Pattern shape = parallelogram | 75c |
| Coordinate x | 75d |
| Coordinate y | 75e |
| Pattern size | 75f |

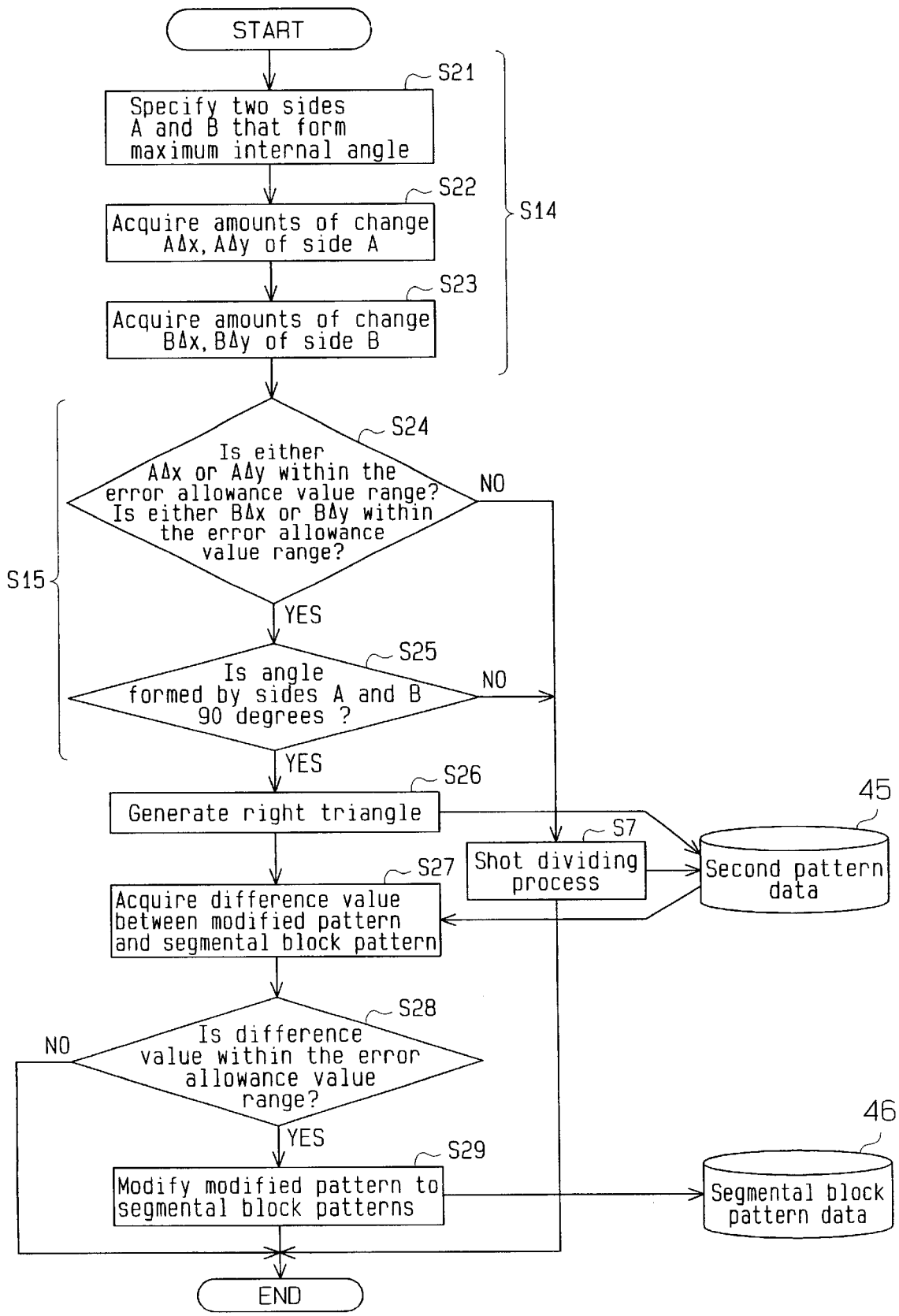

Fig.16A
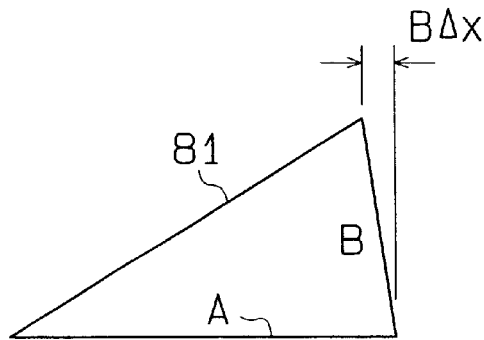
Fig.16C
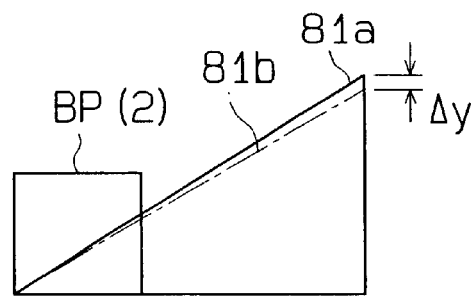
Fig.16B
Fig.16D
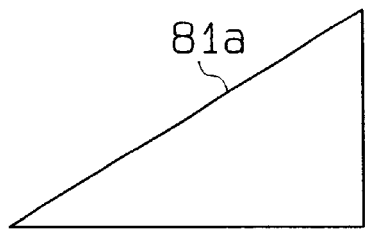
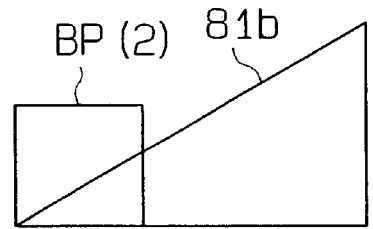
Fig.17
| |
|---|
| Block number = 2 ~82 |
| Block Type = segment |
| Pattern shape = triangle |
| Coordinate x |
| Coordinate y |
| Pattern size |

Fig. 18A  Fig. 18B
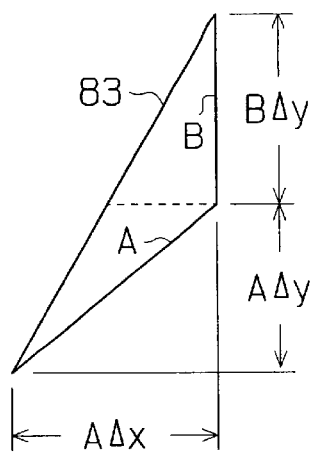
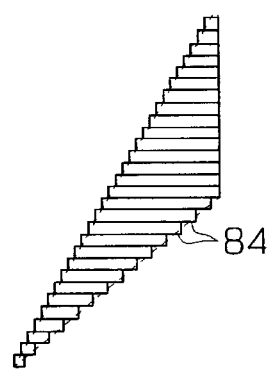
Fig. 19A  Fig. 19B  Fig. 19C  Fig. 19D
Fig. 20
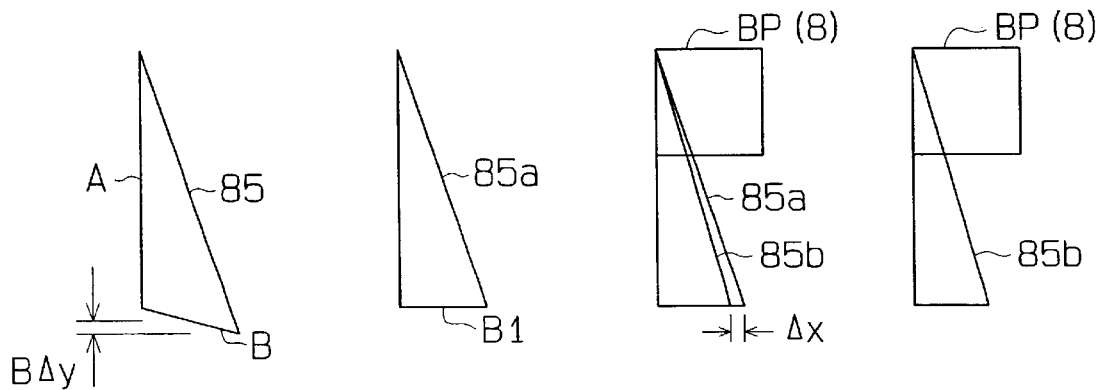

Fig.22A
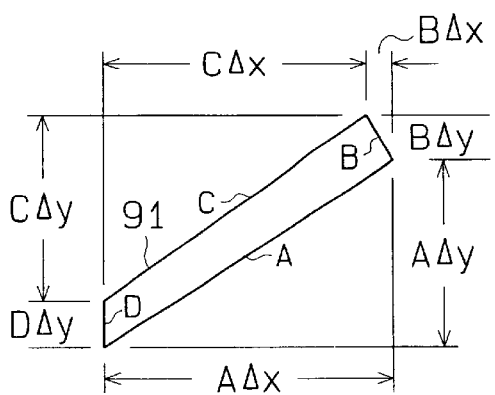
Fig.22B
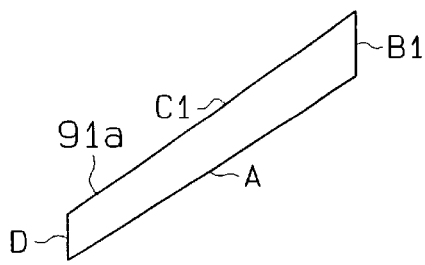
Fig.22C
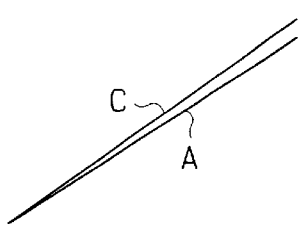
Fig.22D
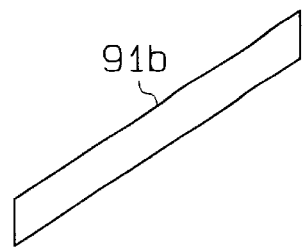
Fig.22E
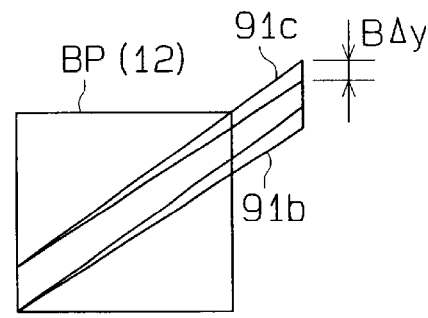
Fig.22F
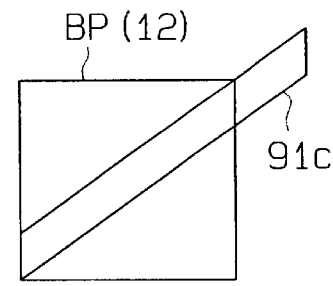
Fig.23
| |
|---|
| Block number = 12 |
| Block Type = segment |
| Pattern shape = parallelogram |
| Coordinate x |
| Coordinate y |
| Pattern size |
92

Fig.27A
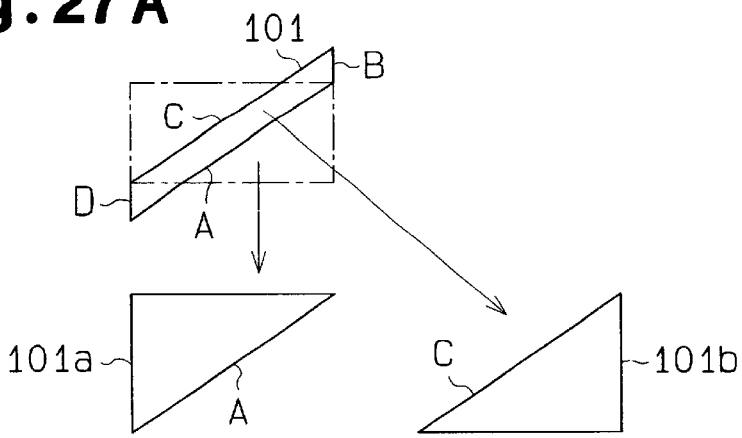
Fig.27B   Fig.27C   Fig.27D
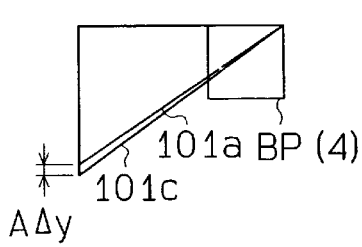 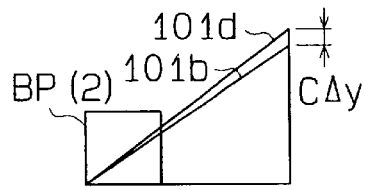 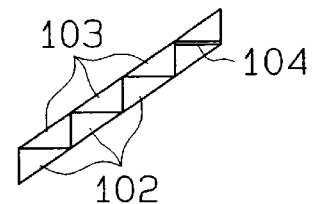
Fig.28A   Fig.28B
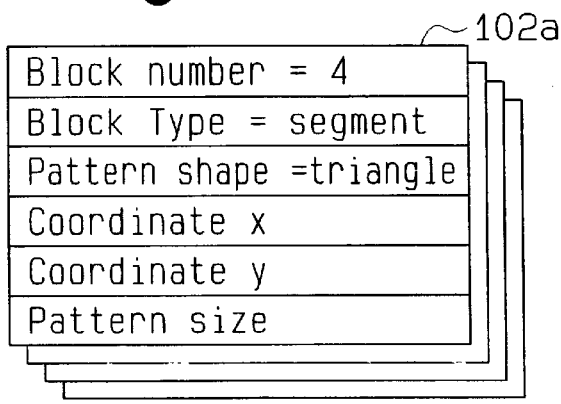 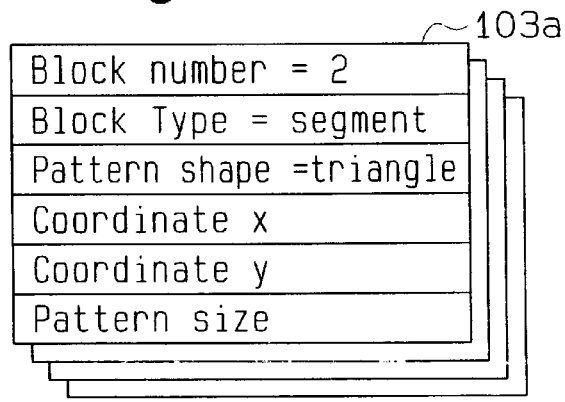
Fig.28C
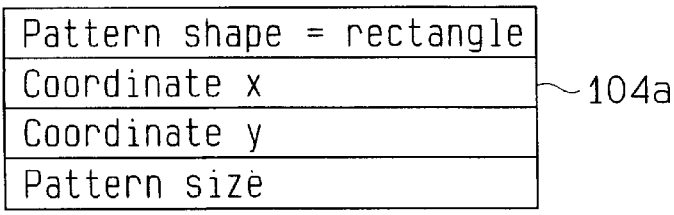

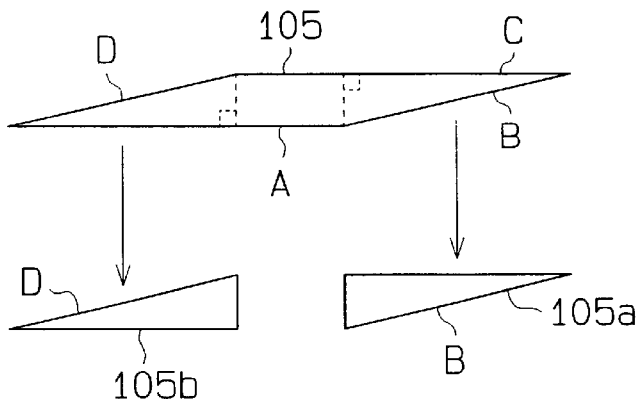
Fig.29A
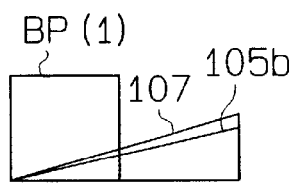
Fig.29B
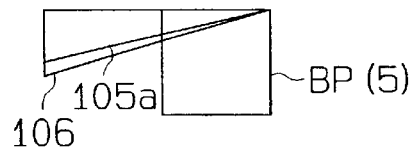
Fig.29C
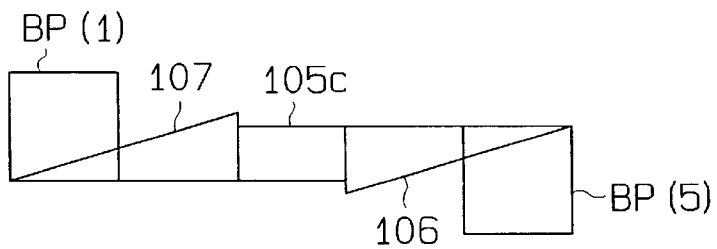
Fig.29D
Fig.30A
~107a
| Block number =1 |
| Block Type = segment |
| Pattern shape = triangle |
| Coordinate x |
| Coordinate y |
| Pattern size |
Fig.30B
~106a
| Block number =5 |
| Block Type = segment |
| Pattern shape = triangle |
| Coordinate x |
| Coordinate y |
| Pattern size |
Fig.30C
~105ca
| Pattern shape = rectangle |
| Coordinate x |
| Coordinate y |
| Pattern size |

Fig. 32A
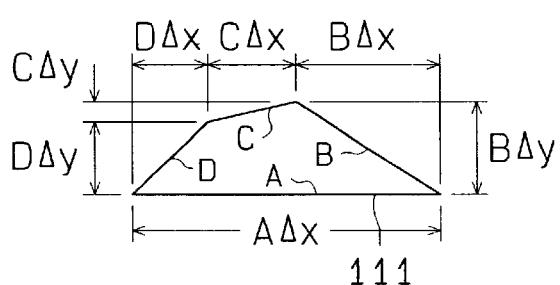
Fig. 32C
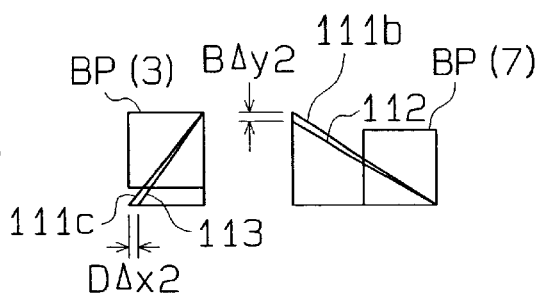
Fig. 32B
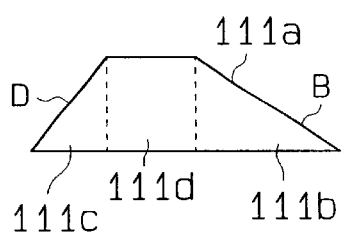
Fig. 32D
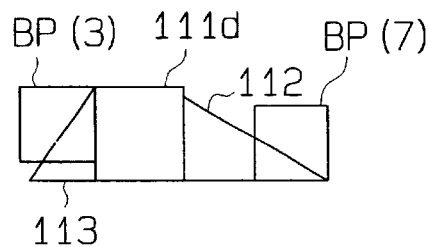
Fig. 33A
| 113a |
|---|
| Block number =3 |
| Block Type = segment |
| Pattern shape = triangle |
| Coordinate x |
| Coordinate y |
| Pattern size |
Fig. 33B
| 112a |
|---|
| Block number =7 |
| Block Type = segment |
| Pattern shape = triangle |
| Coordinate x |
| Coordinate y |
| Pattern size |
Fig. 33C
| 111da |
|---|
| Pattern shape = rectangle |
| Coordinate x |
| Coordinate y |
| Pattern size |

METHOD AND APPARATUS FOR GENERATING SEMICONDUCTOR EXPOSURE DATA

BACKGROUND OF THE INVENTION

The present invention relates to semiconductors, and, more particularly, to method and apparatus for generating exposure data of use in a design pattern of a semiconductor integrated circuit on an exposure medium.

FIG. 1 is a schematic diagram of an electron beam (EB) exposure apparatus. The EB exposure apparatus has a stencil mask (or block mask) 12 and a plate 11 having a rectangular opening 13. As shown in FIG. 2, the stencil mask 12 has a plurality of first transmission apertures 14 having rectangular shapes, and a plurality of block areas 15.

Second transmission apertures 16 are formed in some block areas 15, and third transmission apertures 17 are formed in the other block areas 15. The second transmission apertures 16 take the shapes of "recursive patterns" which are acquired by extracting common portions from layout pattern data of LSI circuits. The recursive patterns include plural kinds of patterns. The block areas 15 in which the second transmission apertures 16 are formed are called "recursive blocks". The third transmission apertures 17 take the shapes of predetermined "segmental patterns" including oblique sides. That is, segmental patterns include oblique sides corresponding to the size of the block areas 15. The block areas 15 in which the third transmission apertures 17 are formed are called "segmental blocks".

Referring again to FIG. 1, an electron beam 10 is deflected by a first electromagnetic deflector 19 before passing the plate 11. The electron beam 10 is then deflected by a second electromagnetic deflector 20 before passing any one of the first to third transmission apertures 14–17 of the stencil mask 12. Accordingly, the cross-sectional shape of the electron beam 10 or the shape of its exposure pattern is changed. The electron beam 10 after it has passed the stencil mask 12 is further deflected by a third electromagnetic deflector 21. As a platform or stage 22 is moved along the X and Y axes, a desired pattern is exposed on a predetermined area of a wafer 23 located on the stage 22.

The size of a rectangular pattern exposed on the wafer 23 is determined by adjusting the degree of overlapping of the beam passing through the plate 11 with the associated first transmission aperture 14. This exposure scheme is called a variable rectangular system. As the electron beam 10 passes any second transmission aperture 16, the associated recursive pattern is exposed by a single shot. In a block exposure scheme using "recursive blocks", the third electromagnetic deflector 21 and the stage 22 are controlled to expose recursive patterns of the same shape on a plurality of areas of the wafer 23. As this block exposure involves fewer shots, the exposure time is decreased. In a block exposure scheme using "segmental blocks", as an electron beam passes any third transmission aperture 17, the associated segmental pattern is exposed by a single shot. Combining some segmental patterns permit a pattern of a desired shape to be exposed on the wafer.

As shown in FIG. 3A, in a case where the variable rectangular system is used to expose a pattern with an oblique side 24, on a wafer 23, for example, the pattern is formed by shooting a plurality of rectangular patterns 25 at a time. This scheme however increases the number of shots and elongates the exposure time. Further, this scheme exposes the oblique side 24 of the pattern in a stepwise form. To make the oblique side 24 as straight a line as possible, the rectangular patterns 25 constituting the pattern should have relatively narrow widths. This approach would result in an undesirable increase in the number of rectangular patterns 25 or the number of shots.

FIG. 3B shows a pattern formed by combining triangular patterns 26a and 26b and rectangular patterns 27a and 27b to improve the linearity of the oblique side 24 of the pattern. The triangular patterns 26a and 26b are formed by the third transmission aperture 17 formed in the stencil mask 12. The third transmission aperture 17 has a right-triangular shape including an oblique side which has the same inclination as the oblique side 24 of the pattern. The pattern can be formed with fewer shots than is required by the scheme in FIG. 3A by individually shooting the triangular patterns 26a and 26b and the rectangular patterns 27a and 27b. The triangular pattern 26b having a relatively small size is obtained by adjusting the degree of overlapping of the beam 10, which has passed the plate 11, with the associated third transmission aperture 17. The rectangular patterns 27a and 27b are obtained by adjusting the degree of overlapping of the beam 10, which has passed the plate 11, with the associated first transmission aperture 14.

An exposure data generating apparatus receives layout pattern data from a CAD system (not shown) and performs a graphics process on the layout pattern data. The graphics process includes a sizing process, a shrinking process and a rounding process which converts the coordinates of the layout pattern data to the grids (coordinates) of data the exposure apparatus handles. The exposure data generating apparatus then determines if exposure using the layout patterns on the stencil mask 12 is possible. Exposable layout patterns include, for example, a rectangular pattern 29a in FIG. 4A, right-triangular patterns 29b to 29e in FIG. 4B, parallelogram patterns 29f to 2i in FIGS. 4C and 4D, trapezoidal patterns 29j to 29n in FIGS. 4E and 4F and the patterns of the third transmission apertures 17 shown in FIG. 2. When exposure is possible, the exposure data generating apparatus converts the format of the layout pattern data to an adequate format for the exposure apparatus.

Patterns that cannot be exposed using the patterns on the stencil mask 12 are layout patterns which do not include horizontal and/or vertical sides. The exposure data generating apparatus segments such layout pattern data to produce plural pieces of rectangular pattern data. The exposure data generating apparatus then performs format conversion on the plural pieces of rectangular pattern data and supplies the converted rectangular pattern data to the exposure apparatus. The exposure apparatus carries out divided shot exposure using a plurality of rectangular patterns instead of the patterns on the stencil mask 12.

Depending on the shapes of the layout pattern, the layout pattern data after the graphics process may differ from the layout pattern data before the graphics process. This difference or error leads to an incoincidence between the coordinates of the layout pattern data before processing (format conversion) and the coordinates of the layout pattern data after processing. This leads to a probable case where although the original layout pattern is exposable using the patterns on the stencil mask 12, exposure is actually conducted using plural pieces of rectangular pattern data. This increases the number of shots by the exposure apparatus, increasing the exposure time for a single wafer. Particularly, specific triangular layout patterns excluding triangles having one angle of approximately 45 degrees are likely to be affected by the error. That is, since the graphics process may cause the inclination of the oblique side of a triangle to be varied by the error, the pattern data of the third transmission apertures 17 previously prepared cannot be used for such a specific triangular layout pattern. Therefore, exposure is executed using plural pieces of rectangular pattern data in place of the pattern data of the third transmission apertures 17. This results in an increased number of shots by the exposure apparatus.

Accordingly, it is an objective of the present invention to provide an efficient exposure data generating method and apparatus capable of decreasing the exposure time.

SUMMARY OF THE INVENTION

In one aspect of the present invention, a method for generating exposure data for use in exposing a layout pattern of a semiconductor integrated circuit on a medium using a mask having a plurality of segmental block patterns of predetermined shapes is provided. The method includes the step of performing a first determining step to determine whether the layout pattern can be modified to one or more predetermined exposable patterns without segmenting the layout pattern into a plurality of rectangular patterns. A first modifying step is performed to modify the layout pattern to the one or more predetermined exposable patterns when modification is determined as being possible in the first determining step. A second determining step is performed to determine whether the modified one or more predetermined exposable patterns can be modified to segmental block patterns. A second modifying step is performed to modify the modified one or more predetermined exposable patterns to the segmental block patterns when modification is determined as being possible in the second determining step. A generating step is performed to exposure data using the modified segmental block patterns.

In another aspect of the present invention, an exposure data generating apparatus exposes a layout pattern of a semiconductor integrated circuit on a medium using a mask having a plurality of segmental block patterns of predetermined shapes. The apparatus includes a memory unit having a segmental block pattern data file and a first pattern data file in which layout pattern data is stored. The processing unit, which is connected to the memory unit, receives the layout pattern data from the first pattern data file and processes the layout pattern data to generate exposure data. The processing unit includes first means for determining whether the layout pattern can be modified to one or more predetermined exposable patterns without segmenting the layout pattern into a plurality of rectangular patterns. First modifying means modifies the layout pattern to the one or more predetermined exposable patterns when modification is determined as possible in the first determining means. Second determining means determines whether the modified one or more predetermined exposable patterns can be modified to segmental block patterns. Second modifying means modifies the modified one or more predetermined exposable patterns to the segmental block patterns when modification is determined as being possible in the second determining means. Generating means generates exposure data using the modified segmental block patterns.

In yet another aspect of the present invention, a computer readable recording medium has a program code recorded thereon to generate exposure data for exposing a layout pattern of a semiconductor integrated circuit on a target medium using a mask having a plurality of segmental block patterns of predetermined shapes. The program code includes first means for determining whether the layout pattern can be modified to one or more predetermined exposable patterns without segmenting the layout pattern into a plurality of rectangular patterns. First modifying means modifies the layout pattern to one or more predetermined exposable patterns when modification is determined as being possible in the first determining means. Second determining means determines whether the modified one or more predetermined exposable patterns can be modified to segmental block patterns. Second modifying means modifies the modified one or more predetermined exposable patterns to the segmental block patterns when modification is determined as being possible in the second determining means. Generating means generates exposure data using the modified segmental block patterns.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 11A through 11C illustrate a modification process for a triangular pattern;

FIG. 12 shows the format of the triangular pattern data of FIG. 11C;

FIGS. 13A through 13D illustrate a modification process for a rectangular pattern;

FIG. 14 shows the format of the pattern data of FIG. 13D;

FIG. 15 is a flowchart of a modification process for a triangular pattern;

FIGS. 16A through 16D illustrate a modification process for a first example of a triangular pattern according to the flowchart of FIG. 15;

FIG. 17 shows the format of the pattern data of FIG. 16D;

FIGS. 18A and 18B depict a modification process for a second example of triangular pattern in accordance with the flowchart of FIG. 15;

FIGS. 19A through 19D show a modification process for a third example of a triangular pattern in accordance with the flowchart of FIG. 15;

FIG. 20 shows the format of the pattern data of FIG. 19D;

FIGS. 22A through 22F illustrate a modification process for a first example of a rectangular pattern in according to the flowchart in FIG. 21;

FIG. 23 shows the format of the pattern data of FIG. 22F;

FIGS. 27A through 27D illustrate a modification process for a first example of a rectangular pattern in according to the flowchart of FIG. 26;

FIGS. 28A through 28C show the formats of the pattern data of FIG. 27D;

FIGS. 29A through 29D depict a modification process for a second example of a rectangular pattern in accordance with the flowchart of FIG. 26;

FIGS. 30A through 30C show the formats of the pattern data of FIG. 29D;

FIGS. 32A through 32D illustrate a modification process for a first example of a rectangular pattern according to the flowchart in FIG. 31;

FIGS. 33A through 33C show the formats of the pattern data in FIG. 32D;

DETAILED DESCRIPTION OF THE PREFERRED EMBODIMENTS

Figure 7:
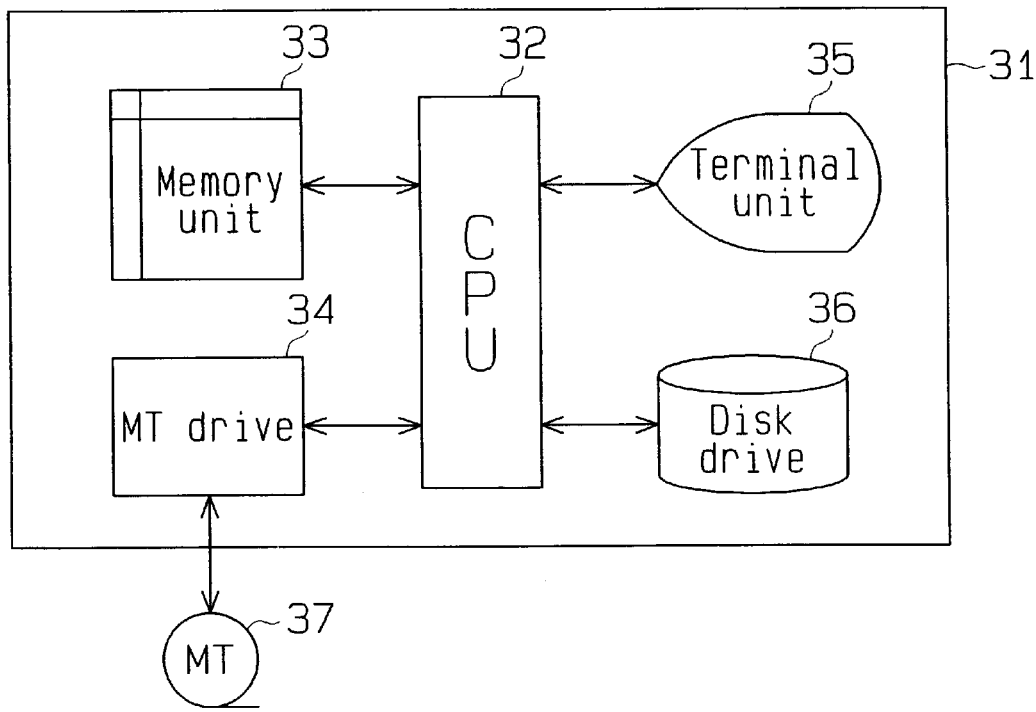
FIG. 7 is a schematic block diagram of an exposure data generating apparatus in accordance with the present invention.

FIG. 7 is a schematic block diagram of an exposure data generating apparatus 31 according to the present invention. The exposure data generating apparatus 31 comprises a central processing unit (CPU) 32, a memory unit 33, an MT (Magnetic Tape) drive 34, a terminal unit 35 and a 25 disk drive 36. The units 33 to 36 are all connected to the CPU 32.

A recording medium such as a magnetic tape (MT) 37 is set in the MT drive 34. Program data for an exposure data generating process is recorded on the magnetic tape 37. The CPU 32 reads the program data from the magnetic tape 37 via the MT drive 34 and stores the data on a storage device, such as a disk drive 36. An operator operates the terminal unit 35 to instruct the CPU 32 to execute the exposure data generating process using the program data. Recording media on which computer software programs are recorded are known by those skill in the art and include at least a semiconductor memory, a floppy disk (FD), a hard disk (HD), optical disks (CD and DVD), magneto-optical disks (MO and MD), a phase change disk (PD) and a magnetic tape.

Figure 5:
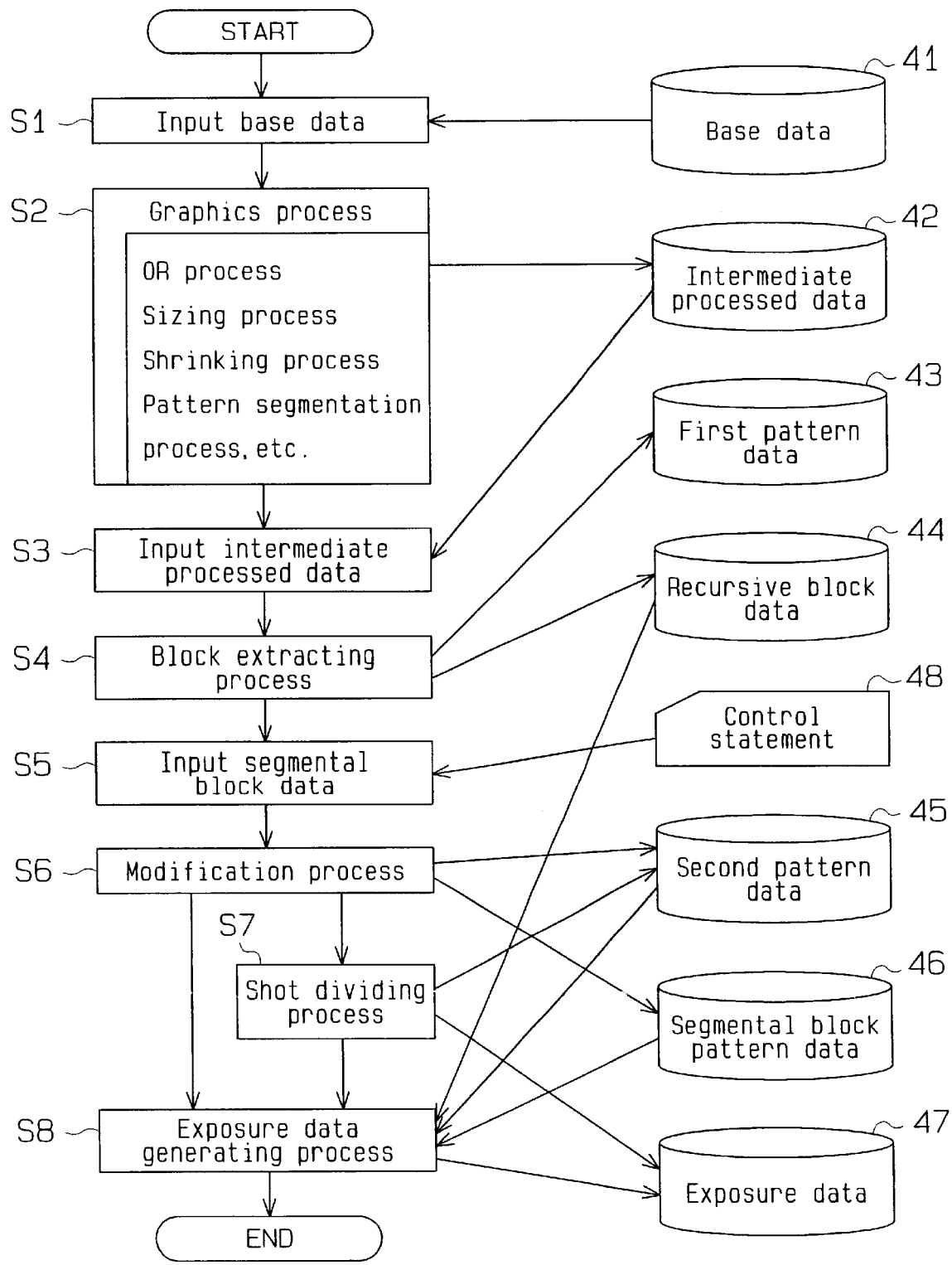
FIG. 5 is a flowchart illustrating an exposure data generating process according to a first embodiment of the present invention.

As shown in FIG. 5, the disk drive 36 has first to seventh data files 41 to 47. The first data file 41 stores design data (layout pattern data) of a semiconductor device (LSI) chip like a memory which includes recursive patterns generated by a CAD system (not shown). The CPU 32 receives pattern data from the first data file 41 and executes an exposure data generating process according to steps S1 to S8 using the pattern data. The CPU 32 selectively stores data generated in the exposure data generating process in the second to seventh data files 42–47.

The exposure data generating process will now be discussed more specifically. In step S1, the CPU 32 receives plural pieces of pattern data from the data file 41 (process data inputting process).

Next, the CPU 32 performs predetermined graphics processes (e.g., an OR process, sizing process and resizing process) on all of the pattern data in step S2. When layout data of a polygon equal to or greater than a pentagon exists, the CPU 32 carries out a segmentation process, segmenting the layout pattern into a triangular layout pattern and a rectangular layout pattern. The CPU 32 stores the processed layout pattern as intermediate processed data in the second data file 42.

In the next step S3, the CPU 32 receives the intermediate processed data from the second data file 42 (intermediate processed data inputting process).

In step S4, the CPU 32 recognizes and extracts layout pattern data having a recursiveness from the intermediate processed data (recursive data extracting process). The CPU 32 stores the extracted layout pattern data as recursive block data in the fourth data file 44. The CPU 32 recognizes first layout pattern data excluding the recursive block data from the intermediate processed data and stores that first layout pattern in the third data file 43.

Figure 2:
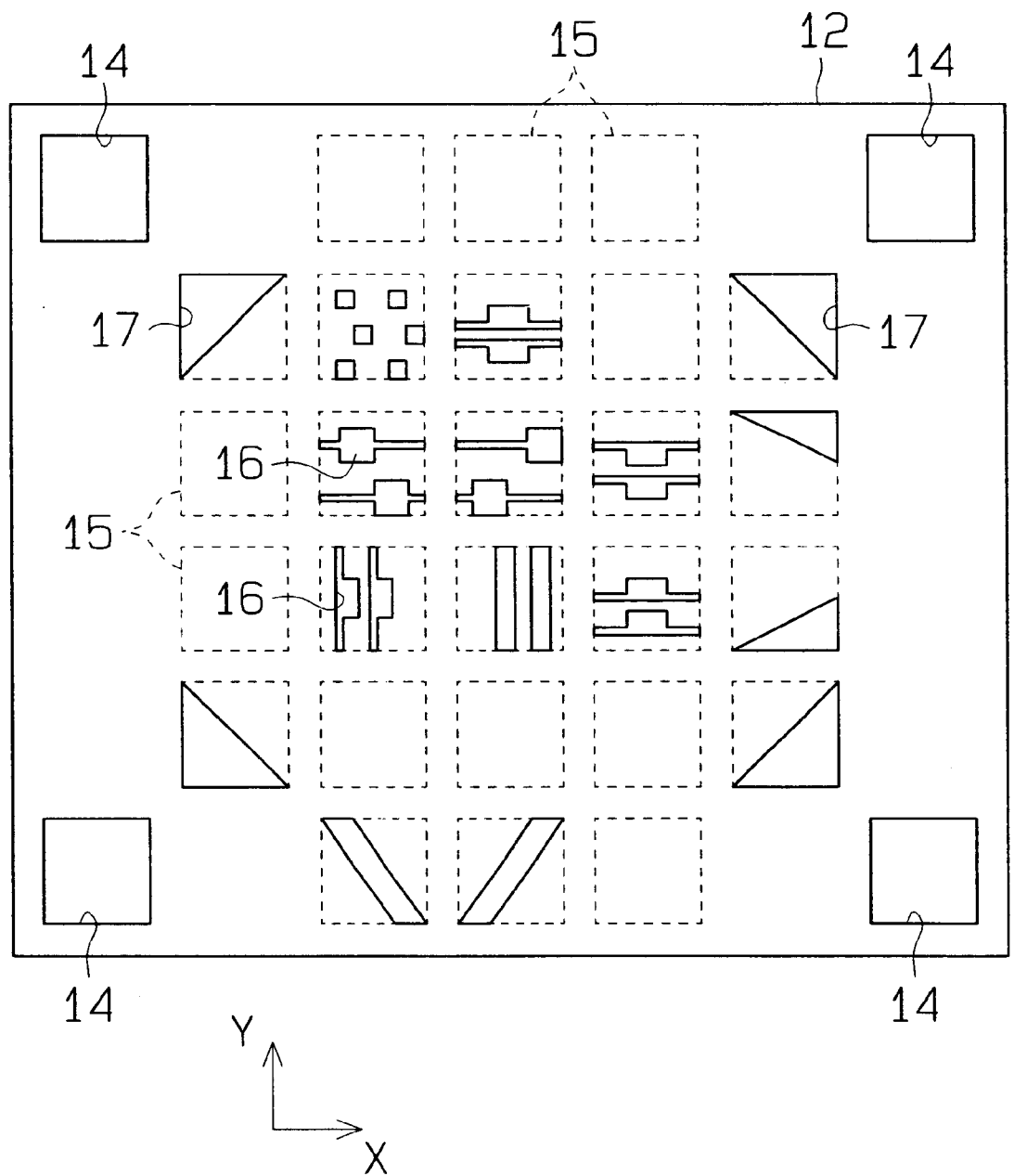
FIG. 2 is a plan view of a stencil mask used by the exposure apparatus in FIG. 1.
Figure 3A:
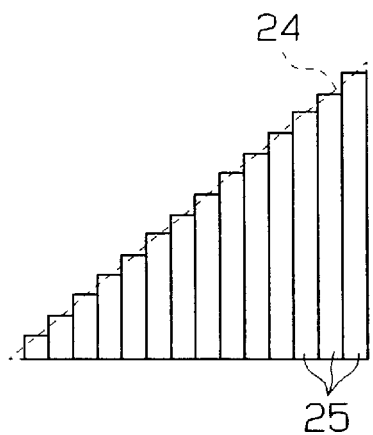
FIGS. 3A and 3B illustrate a conventional exposure data generating process.
Figure 3B:
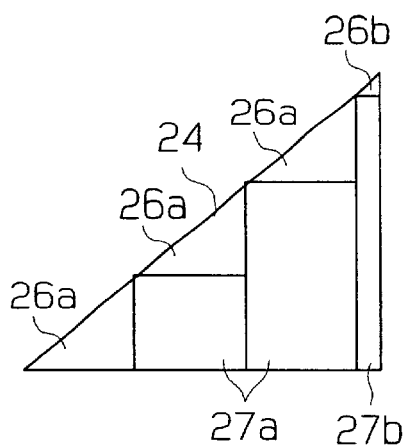
Figure 4A:
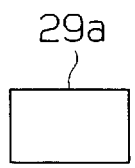
FIGS. 4A through 4F show various kinds of patterns which can be exposed by the exposure apparatus.
Figure 4B:
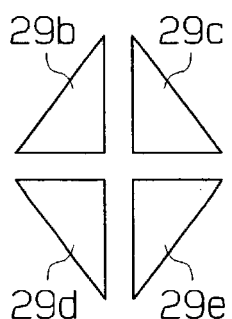
Figure 4C:
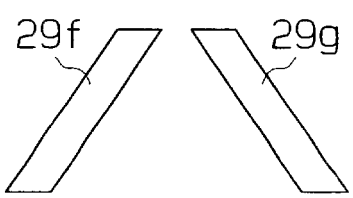
Figure 4D:
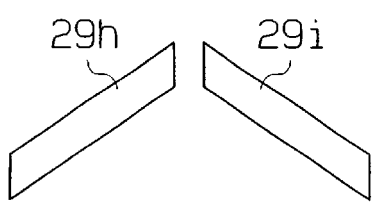
Figure 4E:
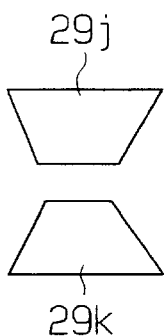
Figure 4F:
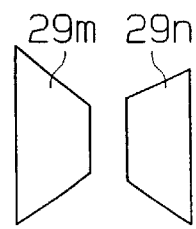

Next, the CPU 32 receives segmental block pattern data to be mounted on the stencil mask 12 of FIG. 2 from the disk drive 36 (segmental block data inputting process) in step S5. The segmental block pattern data is stored in advance in the disk drive as control statements 48.

In step S6, the CPU 32 receives the first pattern data stored in the third data file 43 and carries out recognition of the first pattern data to determine if the first pattern data is within an allowance value range for a predetermined pattern. Based on the result of the decision, the CPU 32 modifies the first pattern data when the first pattern data is within the allowance value range and stores the modified pattern data as second pattern data in the fifth data file 45 (pattern modification process).

Next, the CPU 32 compares the second pattern data with segmental block pattern data and determines based on the comparison result if the second pattern data is modifiable to one or a plurality of segmental block patterns which combined approximate the second pattern data. That is, the CPU 32 determines whether or not one or more segmental block patterns of substantially the same shape as that of the second pattern data can be used in place of the second pattern data. The second pattern data being modifiable, the CPU 32 modifies the second pattern data to segmental block pattern data, and stores the modified segmental block pattern data in the sixth data file 46. Modification of the second pattern data to segmental block pattern data can ensure exposure using segmental blocks. This allows exposure to be implemented with fewer shots than the conventional exposure scheme that uses a plurality of rectangular patterns, and leads to an improvement on the linearity of the oblique side of each pattern.

When having determined in step S6 that the first pattern data is larger than the allowance value of a predetermined pattern, the CPU 32 proceeds to step S7 to segment the first pattern data to plural pieces of rectangular pattern data (shot dividing process). The CPU 32 stores the segmented plural pieces of rectangular pattern data as second pattern data in the fifth data file 45. This shot dividing process may be executed by the exposure apparatus.

After the pattern modification process in step S6 or the dividing process in step S7 is completed for all the first pattern data, the CPU 32 receives individual pattern data from the fourth to sixth data files 44–46, and converts the format of the individual pattern data to the proper format for the exposure apparatus to generate exposure data (exposure data generating process) in step S8. The CPU 32 stores the generated exposure data in the seventh data file 47. This completes the exposure data generating process.

Figure 1:
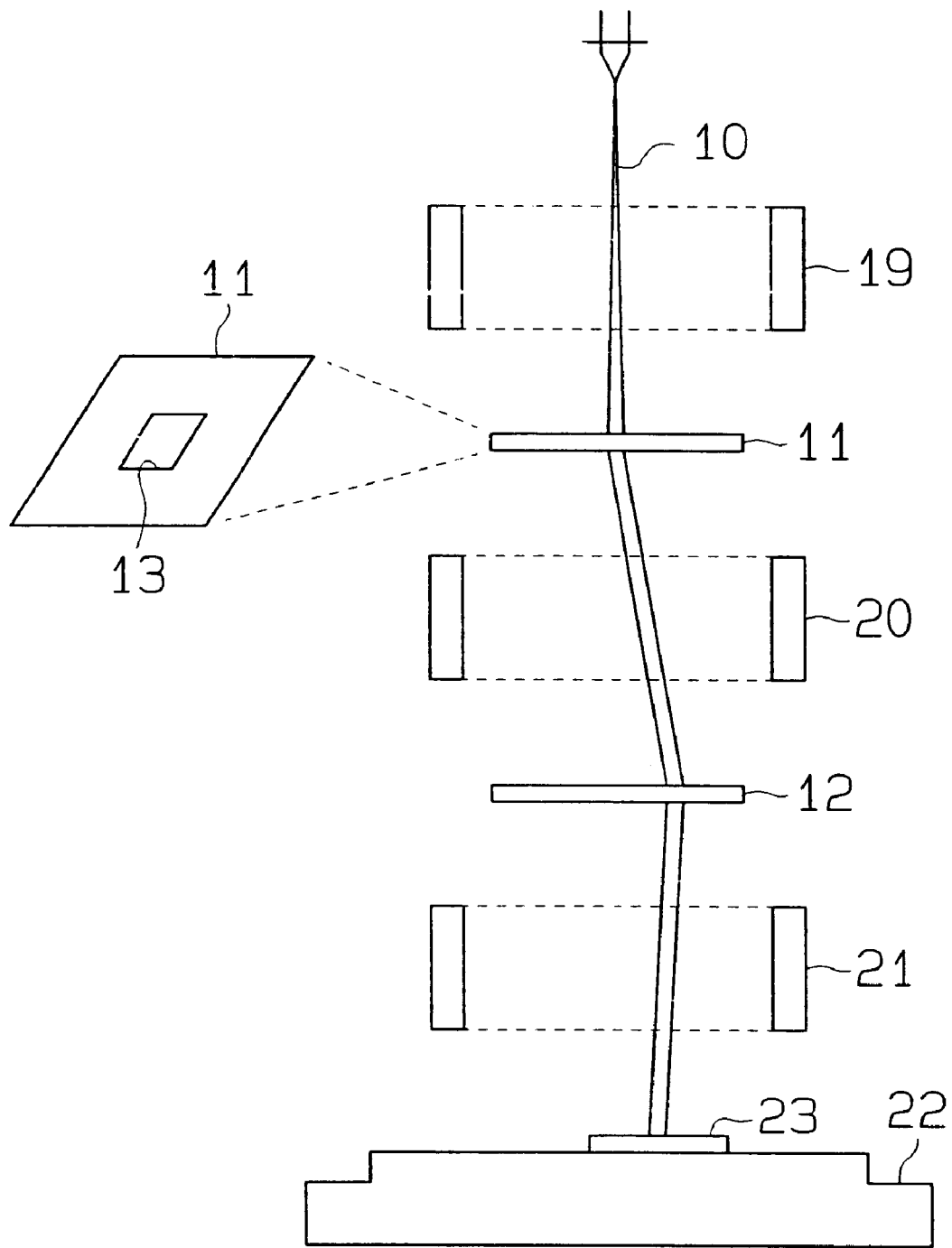
FIG. 1 is a schematic diagram of a conventional block exposure apparatus.

The exposure apparatus shown in FIG. 1 receives from the exposure data generating apparatus 31 the exposure data stored in the seventh data file 47 and uses the exposure data to expose the desired pattern at a predetermined position on the wafer 23 while controlling the first to third electromagnetic deflectors 19–21 and the stage 22.

Figure 6:
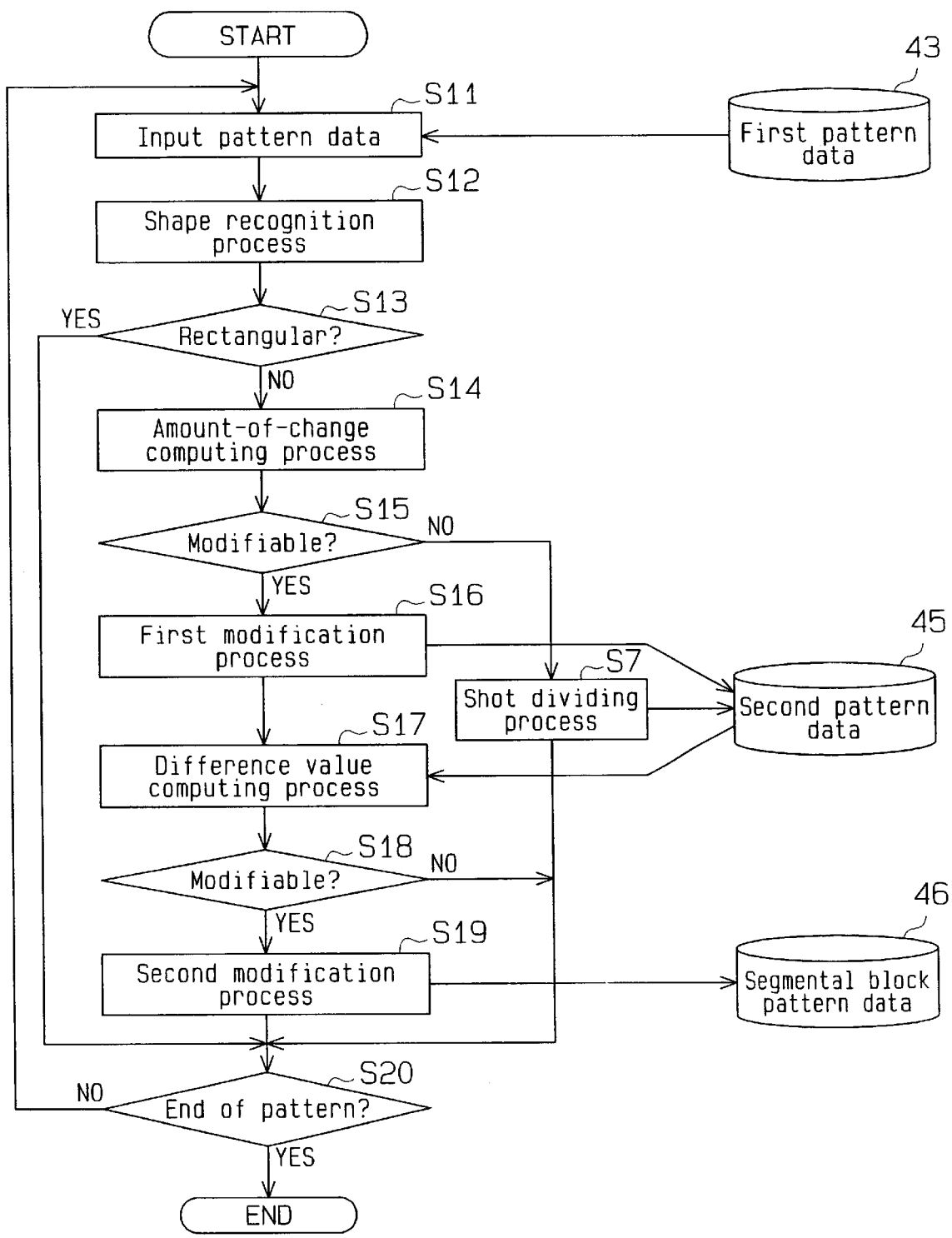
FIG. 6 is a flowchart of a modification process of the process shown in FIG. 5.

FIG. 6 is a flowchart illustrating substeps of step 6, the shape modification process. In step S11, the CPU 32 reads the first pattern data from the third data file 43, and then recognizes if one pattern data is triangular or rectangular (shape recognition process) in step S12. The shape recognition process is performed such that different modification processes are executed according to recognized shapes.

In step S13, the CPU 32 determines if the recognized first pattern data is rectangular (rectangular determination process). When the first pattern data is rectangular, no shape modification is needed and the CPU 32 moves from step S13 to step S20 to read the next first pattern data. When the first pattern data is not rectangular, the CPU 32 moves from step S13 to step S14 to perform a shape modification process on this first pattern data.

In step S14, the CPU 32 acquires from the first pattern data the amount of change that is used as a modification determination value (amount-of-change computing process). The amount of change represents a difference between the original first pattern data and the modified first pattern data produced by modifying the first pattern data to exposable predetermined pattern data. The shape of the pattern data is determined by values such as the coordinates of a side and the angle of the side. In this embodiment, a difference between the side coordinates of the original first pattern data and the side coordinates of the modified first pattern data is defined as the "amount of change".

When the first pattern data is triangular, the CPU 32 w specifies two sides that define the largest one of the three internal angles. When the first pattern data is rectangular, the CPU 32 specifies two opposite sides. The CPU 32 acquires the amount of change that is produced by shifting at least one of the specified two sides in the horizontal direction (parallel to the X axis) or the vertical direction (perpendicular to the X axis and parallel to the Y axis).

Figure 8A:
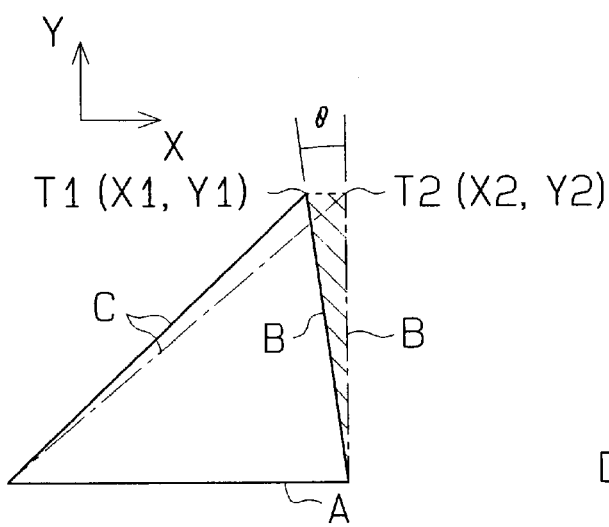
FIGS. 8A and 8B are explanatory diagrams of a process of computing the amount of change included in the modification process shown in FIG. 6.

FIG. 8A shows, as a first example, first pattern data of an original triangle indicated by the solid line and first pattern data of a right triangle after modification, indicated by the dashed line. The original first pattern data includes coordinate data which specifies the positions of the sides A, B and C. That is, the position of each of the sides A, B and C is specified by the coordinates of both ends of that side (the coordinates of each vertex of the triangle). The CPU 32 shifts the sides B and C horizontally so that the two sides A and B which form the largest internal angle form a right angle. In this way, the vertex T1 of the original triangle moves to a vertex T2 of the modified right triangle. The amounts of change of the side B are expressed by differences $\Delta x$ (=x1−x2) and $\Delta y$ (=y1−y2) between the coordinates (x1, y1) of the vertex T1 of the original first pattern data and the coordinates (x2, y2) of the vertex T2 of the modified first pattern data. When the side A is not horizontal, the CPU 32 also obtains the amounts of change $A\Delta x$ and $A\Delta y$ of the side A in the same manner as done for the side B. A difference (angle θ) between the angle between the sides A and B of the original first pattern data and the angle of the sides A and B of the modified first pattern data or the area of the region (hatched) between the side B of the original first pattern data and the side B of the modified first pattern data may be used as the amount of change.

Figure 8B:
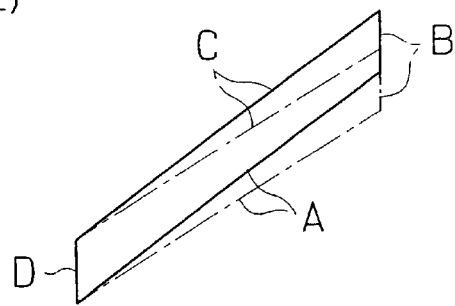

FIG. 8B shows, as a second example, first pattern data of an original parallelogram indicated by the solid line and first pattern data of a parallelogram after modification, indicated by the dashed line. The CPU 32 shifts the sides A, B and C of the parallelogram while maintaining the parallelism of the sides A and C. Thus, two points of intersection of the sides A and C and the side B shift along the Y axis, and the amount of displacement (i.e., a difference $\Delta y$ between the Y coordinates of each intersecting point) is determined as the amount of change.

Referring again to FIG. 6, the CPU 32 determines in step S15 if the amount of change of the first pattern data obtained in step S14 is within a predetermined error allowance value range (i.e., if the first pattern data is modifiable to predetermined pattern data) (first modification determination process). The error allowance value guarantees that a pattern actually formed using the modified first pattern data does not affect the LSI performance. When an interval between adjoining wiring patterns is narrow, for example, signal interference occurs, and when the width of the actual wiring pattern is narrower than the designed wiring pattern, signal attenuation occurs. To prevent these phenomena, the predetermined error allowance value is used. It is therefore possible to set a geven error allowance value in accordance with the layout pattern of an LSI.

When the amount of change of the first pattern data has been determined as being within the error allowance value range, the CPU 32 proceeds to step S16 to modify the first pattern data to predetermined pattern data (first modification process). Specifically, the CPU 32 replaces the coordinates of each side of the original first pattern data to the coordinates of the associated side of the predetermined pattern data. For the triangular pattern shown in FIG. 8A, for example, the coordinates (x1, y1) of the sides B and C included in the first pattern data are replaced with the coordinates (x2, y2). The first pattern data including the coordinates (x2, y2) is stored as second pattern data in the fifth data file 45.

When the amount of change of the first pattern data has been determined as exceeding the error allowance value, the CPU 32 proceeds to step S7 to execute the shot dividing process on the first pattern data.

In step S17, the CPU 32 computes a difference value representing a difference between the second pattern data stored in the fifth data file 45 and the selected block pattern data (difference value computing process). In this embodiment, the difference value is expressed by a difference in the coordinates of a vertex between both patterns. Like the amount of change, the difference value may be expressed by an angle or an area.

Specifically, the CPU 32 reads the second pattern data from the fifth data file 45 and selects a single block pattern similar to the second pattern data or a combination of a plurality of block patterns which can represent the second pattern data.

For the second pattern data of a right triangle, for example, the CPU 32 selects the block pattern of a right triangle similar to the former right triangle. For the second pattern data of a parallelogram, the CPU 32 selects the block pattern of a parallelogram similar to the former parallelogram. A parallelogram can be expressed by a combination of a plurality of right triangles. The CPU 32 thus selects the block patterns of a plurality of right triangles which express a parallelogram.

Figures 9A, 9B, 9C, 10:
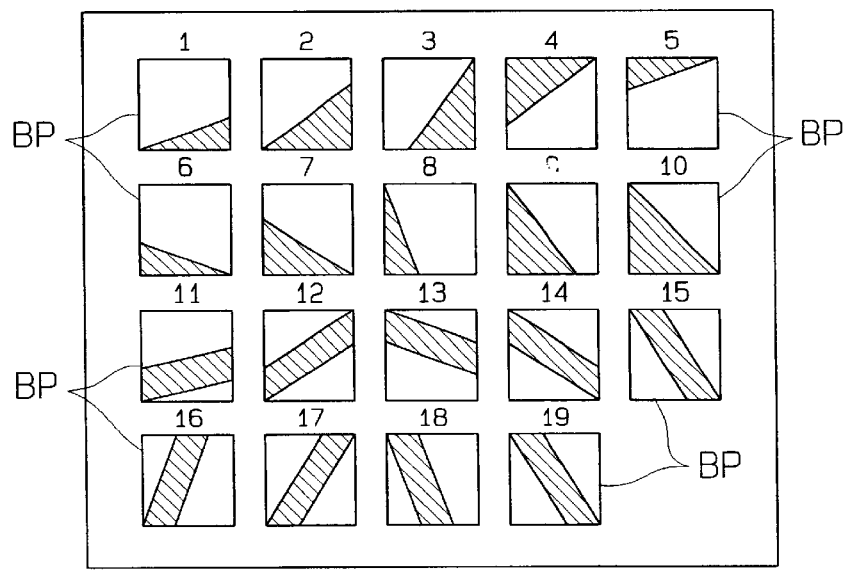
FIG. 9A shows the format of recursive block pattern data.
FIG. 9B shows the format of segmental block pattern data.
FIG. 9C shows the format of original pattern data.
FIG. 10 depicts block patterns registered in the exposure data generating apparatus of FIG. 7.

FIG. 10 shows predetermined registered segmental block patterns. Each segmental block has a pattern formed by a transmission aperture of its own predetermined shape (hatched). A specific block number is assigned to each segmental block. This block number is assigned to an area 52a of segmental block pattern data 52 shown in FIG. 9B. The exposure apparatus selects the block area 15 on the stencil mask 12 where the transmission aperture 17 corresponding in shape to the block pattern that has been selected based on the block number. As a result, the block pattern corresponding to the block number is exposed on the wafer 23. Exposure data includes the segmental block pattern data 52 in FIG. 9B and recursive block data 51 in FIG. 9A and pattern data 53 in FIG. 9C.

The CPU 32 then enlarges or reduces data of the selected block pattern in the X and Y directions in such a way that the size of the selected block pattern substantially coincides with the size of the second pattern data. The CPU 32 further computes a difference between the coordinates of each side of the enlarged or reduced block pattern with the coordinates of each associated side of the second pattern data.

In step S18, the CPU 32 compares the difference value computed in step S17 with the predetermined error allowance value to determine if the second pattern data is modifiable to segmental block pattern data (second modification determination process).

When the difference value is within the error allowance value range, the CPU 32 determines the second pattern data as being modifiable to segmental block pattern data and proceeds to step S19. When the difference value exceeds the error allowance value, the CPU 32 determines the second pattern data is unmodifiable to segmental block pattern data and proceeds to step S20. That is, the CPU 32 leaves the subroutine and goes to step S8. In step S8, the CPU 32 converts the format of the second pattern data to generate exposure data and stores the exposure data in the seventh data file 47. As the exposure data is prepared from pattern data not having undergone shot division, the amount of the exposure data is less than the amount of the rectangular pattern data that has undergone shot division in step S7. The exposure apparatus receives the exposure data from the seventh data file 47, generates plural pieces of rectangular segmental pattern data from the exposure data and carries out exposure using the generated rectangular segmental pattern data. The generation of rectangular segmental patterns by the exposure apparatus may be implemented by the exposure data generating apparatus 31.

In step S19, the CPU 32 modifies the second pattern data to segmental block pattern data, and stores the segmental block pattern data in the sixth data file 46 (second modification process). That is, the CPU 32 converts the format of the second pattern data to the format of the segmental block pattern data, and stores the segmental block patterns in the sixth data file 46.

This process will be discussed below more specifically. The recursive block data 51 in FIG. 9A is for exposing a pattern with a recursiveness by using the second transmission aperture 16 formed in any recursive block in FIG. 2. The recursive block data 51 has a number data area 51a, a block type data area 51b, and layout coordinates data areas 51c and 51d all of a recursive block on the stencil mask, the data areas 51c and 51d representing the layout coordinates on the chip.

The segmental block pattern data 52 in FIG. 9B is used for exposing a pattern using the third transmission aperture 17 formed in any segmental block in FIG. 2. The segmental block pattern data 52 has a number data area 52a, a block type data area 52b, a pattern shape data area 52c, layout coordinates data areas 52d and 52e, and a pattern size data area 52f of a segmental block on the stencil mask.

The pattern data 53 in FIG. 9C, which is first and second pattern data, has a pattern shape data area 53a, layout coordinates data areas 53b and 53c and a pattern size data area 53d. The first pattern data is the pattern data for which no recursive block pattern can be used. The second pattern data is the pattern data for which no segmental block pattern can be used.

The CPU 32 stores the block number of the block pattern, selected in step S17, in the data area 52a of the segmental block pattern data 52, stores information indicative of the segmental block in the data area 52b, and stores information indicative of the shape of the first pattern data in the data area 52c. The CPU 32 stores the layout coordinates (x, y) and the pattern size, stored in the data areas 53b–53d, in the data areas 52d–52f, respectively.

The process of steps S14 to S19 for triangular first pattern data will be discussed below with reference to FIGS. 11A to 11C and 12. FIG. 11A shows a triangular first pattern 61 read from the third data file 43. The CPU 32 acquires the amounts of change of the first pattern 61 when the triangle is modified to a right triangle. The amounts of change $A\Delta x$, $A\Delta y$, $B\Delta x$ and $B\Delta y$ based on the sides A and B that define the largest internal angle of the first pattern 61 are obtained. As the side A is horizontal, the amounts of change $A\Delta x$ and $A\Delta y$ are set to "0".

The CPU 32 then determines if the amounts of change BΔx and BΔy on the side B are within the error allowance value range. When those amounts are within the error allowance value range, the CPU 32 modifies the first pattern data 61 to second pattern data 61a indicated by the dashed line in FIG. 11B. The CPU 32 selects a segmental block pattern which approximates the second pattern 61a. In this case, the CPU 32 selects a segmental block pattern BP with a number "2" shown in FIG. 10. This segmental block pattern BP(2) is indicated by the dashed lines in FIGS. 11B and 11C.

The CPU 32 then enlarges the segmental block pattern BP(2) to generate an enlarged pattern 63, and compares the second pattern 61a with the enlarged pattern 63. The base of the enlarged pattern 63 substantially coincides in length with the base A of the second pattern 61a, producing a difference (Δy) between the length of the side B1 of the second pattern 61a and the length of the side of the enlarged pattern 63. This difference Δy as a difference value is compared with the error allowance value. When the difference Δy is within the error allowance value range, the second pattern is modified to the segmental block pattern BP(2). That is, the CPU 32 stores the number "2" of the selected block pattern data BP(2) in a data area 64a, information indicative of "segmentation" in a data area 64b, and information indicative of "triangle" in a data area 64c as shown in FIG. 12. The CPU 32 further stores the X coordinate and Y coordinate at which the second pattern is to be laid out in data areas 64d and 64e, and size information of the second pattern in a data area 64f. As shown in FIG. 11C, exposure is carried out using the segmental block pattern BP(2) in place of the original first pattern 61 in this manner. When the segmental block pattern substantially matches the recursive block pattern, the data stored in the data area 64b may represent "recursive" instead of "segmentation". In this case, the exposure apparatus executes the exposure process without determination and computation for shot division.

The process for a rectangular first pattern will be discussed with reference to FIGS. 13 and 14. When a rectangular first pattern 71 as shown in FIG. 13A is read from the third data file 43, the CPU 32 specifies a pair of sides B and D opposite to each other in the vertical direction, and acquires the amount of change BΔx on the side B when the sides B and D shift in parallel. The CPU 32 compares the amount of change BΔx with the error allowance value to determine if the first pattern 71 is modifiable to a parallelogram.

Next, the CPU 32 acquires, as a difference value Δy1, a difference between the coordinates of both first ends of the sides A and C whose second ends are placed one on the other as shown in FIG. 13B. When the difference value Δy1 is within the error allowance value range, the CPU 32 modifies the first pattern 71 to a parallelogram. When the difference value Δy1 exceeds the error allowance value, the CPU 32 modifies the first pattern 71 to a trapezoid.

Next, the CPU 32 selects a segmental block pattern which approximates the modified second pattern 72. In this case, the CPU 32 selects a segmental block pattern BP(11) with a number "11" in FIG. 10 (indicated by the broken line in FIG. 13C).

The CPU 32 then enlarges the segmental block pattern BP(11) to generate an enlarged pattern 74. At this time, the length of the left side and the side D of the enlarged pattern 74 substantially coincide with each other. The CPU 32 acquires, as a difference value, a difference (Δy2) between the side A1 (or the side C1) of the enlarged pattern 74 and the side A of the second pattern 72 in the direction of the Y axis. When determining that the difference value Δy2 is within the error allowance value range, the CPU 32 modifies the second pattern 72 to the segmental block pattern BP(11). That is, the CPU 32 stores the number "11" of the selected segmental block pattern BP(11) in a data area 75a, information indicative of "segmentation", a block type, in a data area 75b, and information indicative of "parallelogram", a pattern shape, in a data area 75c as shown in FIG. 14. Further, the CPU 32 stores the X coordinate and Y coordinate at which the second pattern should be laid out, in data areas 75d and 75e, and pattern size information in a data area 75f. As shown in FIG. 13D, exposure is carried out using the segmental block pattern BP(11) instead of the second pattern 72.

In step S20 in FIG. 6, the CPU 32 determines if the shape modification process has been completed for every first pattern data (completion determination process). When there is any first pattern data that has not undergone the modification process, the CPU 32 proceeds to step S11 from step S20 and repetitively executes the loop of steps S11–S20.

The process of steps S14 to S19 for various triangular shapes will now be discussed specifically.

(1) Process for First Pattern Data 81 of a Triangular Shape Shown in FIG. 16A

Steps S21 to 23 in FIG. 15 are substeps of step S14 (amount-of-change computing process) in FIG. 6, and steps S24 and S25 in FIG. 15 are substeps of step S15 (first modification determination process) in FIG. 6. Steps S26 to S29 in FIG. 15 respectively correspond to steps S16–S19 in FIG. 6.

First, the CPU 32 specifies sides A and B which form the maximum internal angle of the first pattern 81 in step S21, then acquires the amounts of change of the side A, AΔx and AΔy, in step S22. As the side A is horizontal and the ends of the side A do not shift horizontally, the CPU 32 sets the amounts of change AΔx and AΔy to "0". The CPU 32 then acquires the amounts of change of the side B, BΔx and BΔy, in step S23.

When the CPU 32 determines in step S24 that the amounts of change AΔy and BΔx of the sides A and B are both within the error allowance value range, the CPU 32 determines that the first pattern 81 can be modified to an exposable right triangle, and proceeds to step S25. The CPU 32 determines in step S25 that modifying the first pattern 81 to set the side B perpendicularly will set the internal angle between the sides A and B to 90 degrees, and proceeds to step S26.

In step S26, the CPU 32 modifies the first pattern 81 to generate a second pattern 81a (see FIG. 16B) of a right triangle with the side B set perpendicular, and stores the second pattern data in the fifth data file 45.

In the next step S27, the CPU 32 selects a segmental block pattern BP with a block number "2" which approximates the second pattern 81a, and compares the second pattern 81a with the selected segmental block pattern BP(2).

At this time, as shown in FIG. 16C, the segmental block pattern BP(2) is enlarged to the size of the second pattern 81a, generating an enlarged pattern 81b, and the enlarged pattern 81b is put over the second pattern 81a to acquire the difference Δy between both patterns as a difference value.

The CPU 32 determines in step S28 that the difference value (Δy) is within the error allowance value range, and then goes to step S29 and modifies the enlarged pattern 81b in such a way that the inclination of the oblique side of the second pattern 81a substantially coincides with the inclination of the segmental block pattern BP(2) as shown in FIG. 16D. That is, segmental block pattern data 82 (see FIG. 17) for the second pattern 81a is generated. The CPU 32 stores the segmental block pattern data 82 in the sixth data file 46, and terminates the shape modification process.

(2) Process for First Pattern Data 83 of a Triangular Shape Shown in FIG. 18A

In step S21, the CPU 32 specifies sides A and B which form the maximum internal angle of the first pattern 83 in FIG. 18A, and then acquires the amounts of change of the side A, A$\Delta$x and A$\Delta$y, and the amounts of change of the side B, B$\Delta$x and B$\Delta$y, in steps S22 and S23.

In step S24, the CPU 32 determines that the amounts of change A$\Delta$x and A$\Delta$y of the side A are both greater than the error allowance value, and thus determines that the first pattern 83 is unmodifiable to an exposable shape. Then, the CPU 32 segments the first pattern 83 into a plurality of rectangular patterns 84 as shown in FIG. 18B in step S7, and stores the pattern data of the rectangular patterns 84 in the fifth data file 45.

(3) Process for First Pattern Data 85 of a Triangular Shape Shown in FIG. 19A

The CPU 32 specifies sides A and B of the first pattern 85 in step S21, and acquires the amounts of change of the side A, A$\Delta$x and A$\Delta$y, and the amounts of change of the side B, B$\Delta$x and B$\Delta$y, in steps S22 and S23. Next, in step S24, the CPU 32 determines that the amounts of change A$\Delta$x and B$\Delta$y are both within the error allowance value range, and thus determines that the first pattern 85 is modifiable to an exposable shape. In the next step S25, it is determined that the angle between the sides A and B1 is 90 degrees. Then, the CPU 32 generates a second pattern 85a (see FIG. 19B) of a right triangle and stores that second pattern 85a in the fifth data file 45 in step S26.

In the next step S27, the CPU 32 selects a segmental block pattern BP with a block number "8" (see FIG. 10) which approximates the second pattern 85a, and enlarges the segmental block pattern BP(8) to generate an enlarged pattern 85b as shown in FIG. 19C. The CPU 32 compares the enlarged pattern 85b with the second pattern 85a to acquire a difference value $\Delta$x.

In step S28, the difference value $\Delta$x is determined to be within the error allowance value range. In step S29, the enlarged pattern 85b is modified to the segmental block pattern BP(8) as shown in FIG. 19D, yielding segmental block pattern data 86 (see FIG. 20) for the second pattern 85a. The segmental block pattern data 86 is then stored in the sixth data file 46.

The process of steps S14 to S19 for various rectangular shapes will now be discussed specifically.

First, a description will be given of a process when segmental block patterns of a parallelogram are used, with reference to a flowchart in FIG. 21 and FIGS. 22 to 25. Steps S31 and 32 are substeps of step S14 (amount-of-change computing process) in FIG. 6, and steps S33 to S39 are substeps of step S15 (first modification determination process) in FIG. 6. Steps S40 and S44 are substeps of step S16 (first modification process), and steps S41 to S43 respectively correspond to steps S17–S19 in FIG. 6.

(1) Process for First Pattern Data 91 of a Rectangular Shape Shown in FIG. 22A

In step S31, the CPU 32 acquires the amounts of change A$\Delta$x, A$\Delta$y, B$\Delta$x, B$\Delta$y, C$\Delta$x, C$\Delta$y, D$\Delta$x and D$\Delta$y of the four sides A to D of the rectangular first pattern 91. Then, the CPU 32 searches for any amount of change which is within the error allowance value range in step S32, and determines in step S33 based on the search result that the amounts of change B$\Delta$x and D$\Delta$x (D$\Delta$x is zero) of the sides B and D are within the error allowance value range.

Then, the CPU 32 proceeds to step S34 from step S33 and generates a second pattern 91a (see FIG. 22B) having a side B1 obtained by setting the side B perpendicular. Then, in step S36, the CPU 32 determines whether or not the directions of inclination of the sides A and C are identical in order to check if the second pattern 91a approximates a parallelogram. In this case, the directions of inclination of the sides A and C are identical, the CPU 32 proceeds to step S38 to acquire, as a difference value $\Delta$y, a difference between the coordinates of second ends of the sides A and C with first ends of both sides A and C overlapping each other, as shown in FIG. 22C.

When the CPU 32 determines in step S39 that the difference value $\Delta$y is within the error allowance value range, the CPU 32 goes to step S40 and modifies the second pattern 91a so that the inclination of the side C substantially coincides with that of the side A, generating a third pattern 91b (see FIG. 22D) of a parallelogram. The CPU 32 then stores the third pattern 91b in the fifth data file 45.

In the next step S41, the CPU 32 selects a segmental block pattern BP with a block number "12" in FIG. 10 which approximates the third pattern 91b, and compares the third pattern 91b with the segmental block pattern BP(12). At this time, the segmental block pattern BP(12) is enlarged to the size of the third pattern 91b, generating an enlarged pattern 91c, and the enlarged pattern 91c is placed over the third pattern 91b to acquire a difference value $\Delta$y between both patterns.

In the next step S42, the CPU 32 compares the difference value $\Delta$y with the error allowance value. In this case, as the difference value $\Delta$y is within the error allowance value range, the CPU 32 proceeds to step S43 and modifies the third pattern 91b to generate a modified pattern 91c (having the same reference numeral as the enlarged pattern 91c) having the same inclination as that of a segmental block pattern BP(12) as shown in FIG. 22F. Then, the CPU 32 converts the data format of the modified pattern 91c to the data format of a segmental pattern, generating segmental block pattern data 92 as shown in FIG. 23.

Figure 24A:
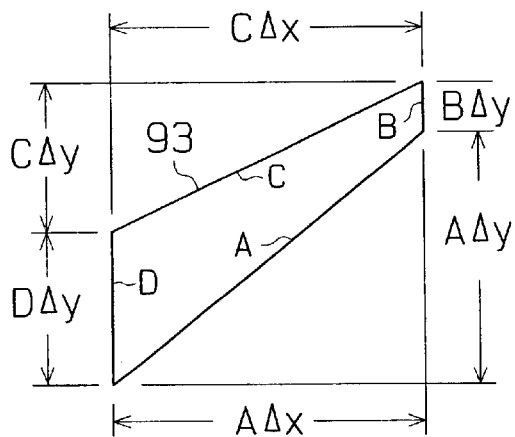
FIGS. 24A and 24B depict a second example of a modification process for a rectangular pattern in accordance with the flowchart of FIG. 21.
Figure 24B:
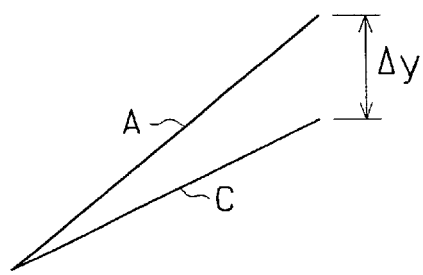

(2) Process for First Pattern Data 93 of a Rectangular Shape Shown in FIG. 24A

In step S31, the amounts of change of the four sides A to D of the first pattern 93 are obtained. The first pattern 93 being a parallelogram, the individual processes in steps S32, S33, S34 and S36 are executed after which the process goes to step S38. In step S38, a difference value $\Delta$y between the sides A and C is acquired. As the difference value $\Delta$y exceeds the error allowance value, it is determined in step S39 that the first pattern 93 is unmodifiable, and the flow goes to step S44. In step S44, the first pattern 93 is stored as trapezoidal pattern in the fifth data file 45.

Figure 25A:
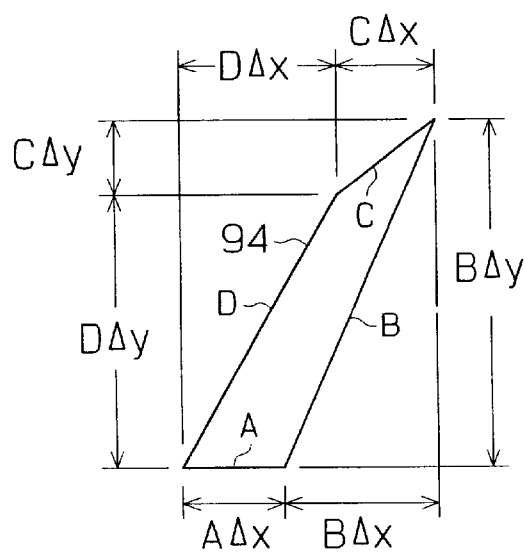
FIGS. 25A and 25B show a modification process for a third example of a rectangular pattern in accordance with the flowchart of FIG. 21.

(3) Process for First Pattern Data 94 of a Rectangular Shape Shown in FIG. 25A

Figure 25B:
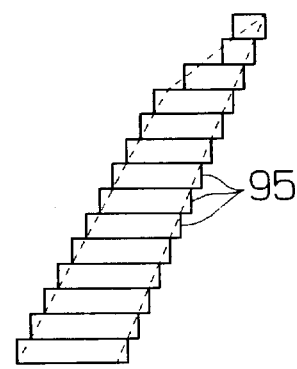

In step S31, the amounts of change of the four sides A to D of the first pattern 94 are obtained. As the amounts of change excluding the amount of change A$\Delta$y (=0) exceed the error allowance value in step S32, the first pattern 94 is determined as unmodifiable in step S33. Then, the first pattern 94 is segmented to a plurality of rectangular patterns 95 as shown in FIG. 25B in step S7, and data of the rectangular patterns 95 are then stored in the fifth data file 45.

A description will now be given of a modification process for a combination pattern of segmental block patterns of a plurality of right triangles of a rectangular first pattern.

Figure 21:
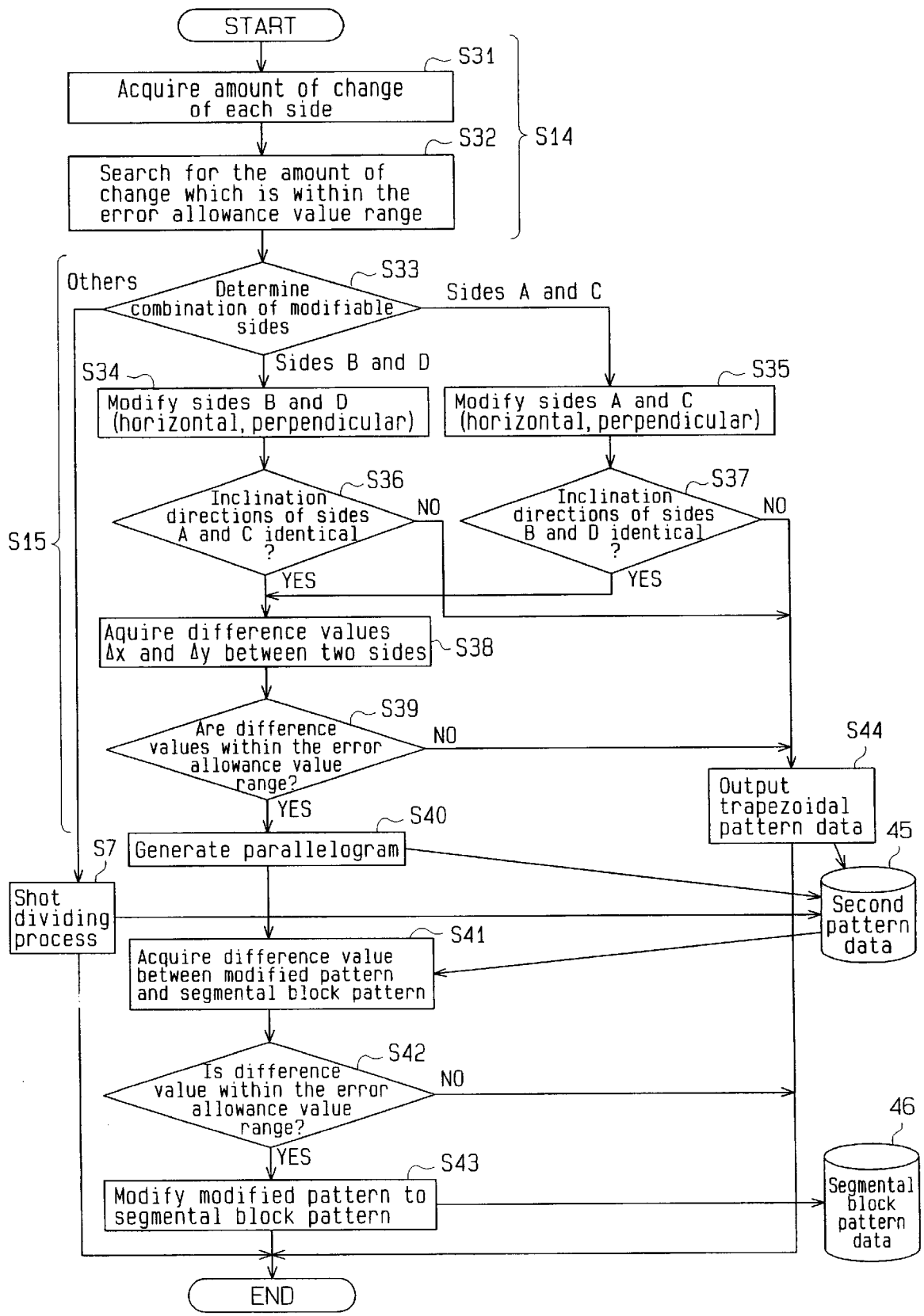
FIG. 21 is a flowchart of a first variation of a modification process for a rectangular pattern.
Figure 26:
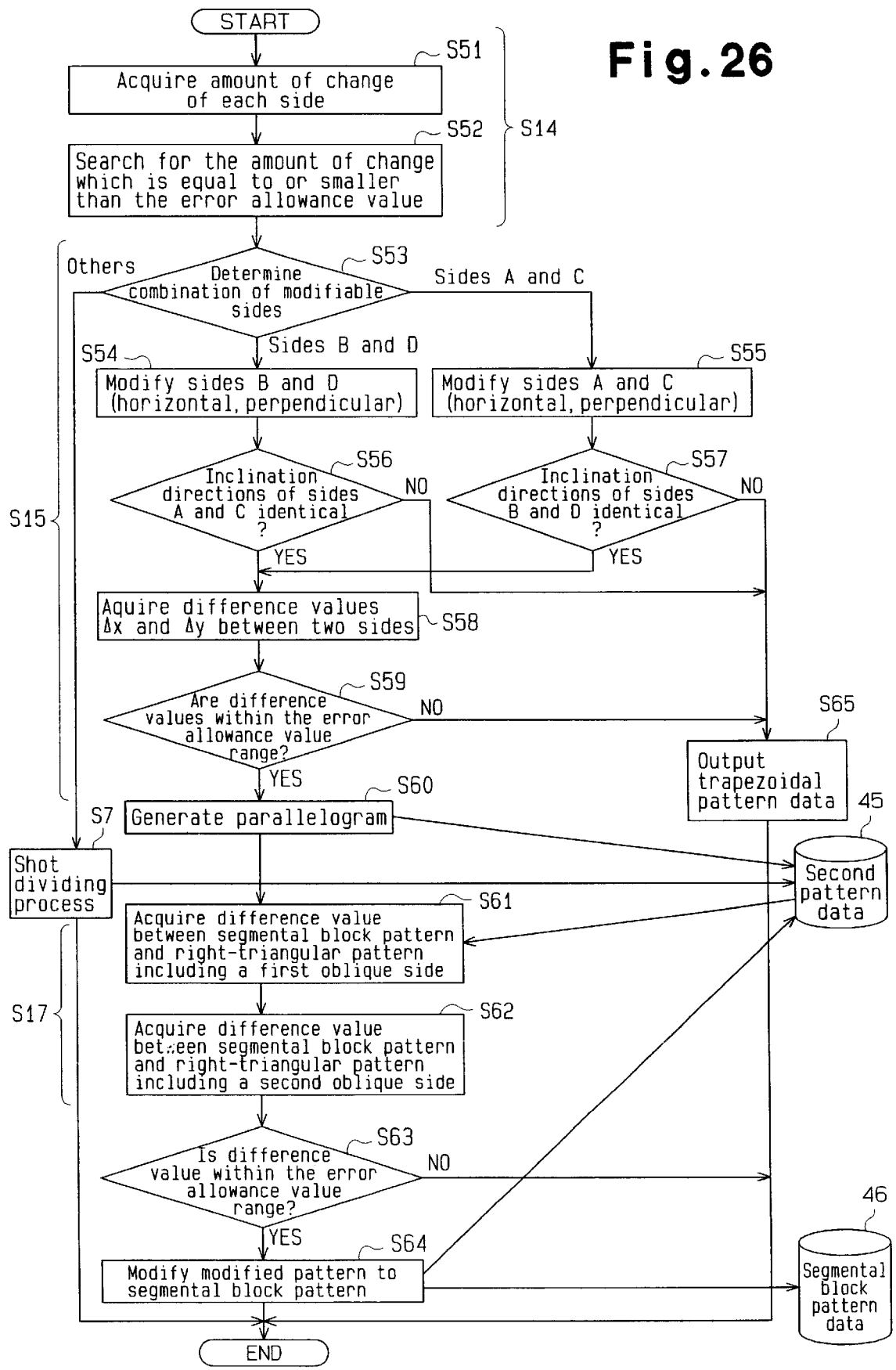
FIG. 26 is a flowchart of a second variation of a modification process for a rectangular pattern.

Steps S51 and S52 in FIG. 26 are substeps of step S14 (amount-of-change computing process) in FIG. 6, and respectively correspond to steps S31 and S32 in FIG. 21. Steps S53 to S59 are substeps of step S15 (first modification determination process) in FIG. 6 and respectively correspond to steps S33–S39 in FIG. 21. Steps S60 and S65 are substeps of step S16 (first modification process) in FIG. 6 and respectively correspond to steps S40 and S44 in FIG. 21. Steps S61 and S62 are substeps of step S17 (difference value computing process) in FIG. 6 and steps S63 and S64 respectively correspond to steps S18 and S19 in FIG. 6.

(1) Process for a First Pattern 101 After the First Modification Process Shown in FIG. 27A After individual processes in steps S51–S59 are executed, the parallelogram first pattern 101 which has undergone the first modification process is generated in step S40. Next, in step S61, the CPU 32 generates a first right-triangular pattern 101a including one oblique side A of the first pattern 101 and selects a segmental block pattern BP(4) with a block number "4" in FIG. 10, which approximates the first right-triangular pattern 101a. As shown in FIG. 27B, the CPU 32 enlarges the selected segmental block pattern BP(4) to the size of the first right-triangular pattern 101a, generating an enlarged pattern 101c. The CPU 32 then compares the enlarged pattern 101c with the first right-triangular pattern 101a to acquire a difference value AΔy.

Then, in step S62, the CPU 32 generates a second right-triangular pattern 101b including another oblique side C of the first pattern 101 and selects a segmental block pattern BP(2) with a block number "2" in FIG. 10, which approximates the second right-triangular pattern 101b. As shown in FIG. 27C, the CPU 32 enlarges the selected segmental block pattern BP(2) to the size of the second right triangle pattern 101b, generating an enlarged pattern 101d. The CPU 32 then compares the enlarged pattern 101d with the second right-triangular pattern 101b to acquire a difference value CΔy.

When the CPU 32 determines in step S63 that the difference values AΔy and CΔy are within the error allowance value range, the CPU 32 proceeds to step S64 and constructs the first pattern 101 by a combination of a plurality of right-triangular segmental block patterns 102 and 103, which are similar pattern to the segmental block patterns BP(4) and BP(2), as shown in FIG. 27D. In other words, the first pattern 101 is segmented to a plurality of segmental patterns 102 and 103. The CPU 32 converts the format of the data of the segmental patterns 102 and 103 to the format of the segmental block pattern data, generating segmental block pattern data including a plurality of segmental pattern data 102a and 103a as shown in FIGS. 28A and 28B.

When the first pattern 101 is assembled by a plurality of segmental patterns 102 and 103 in step S53, a rectangular pattern 104 as shown in FIG. 27D may be needed. In this case, the CPU 32 adds data 104a of the rectangular pattern 104 as shown in FIG. 28C to the segmental block pattern data.

(2) Process for a First Pattern 105 After the First Modification Process Shown in FIG. 29A In steps S51 and S52, first and second right triangles 105a and 105b respectively including the sides B and D of the first pattern 105 are generated, and segmental block patterns BP(5) and BP(1) with block numbers "5" and "1" in FIG. 10, which approximate the first and second right triangles 105a and 105b, are selected respectively.

Next, as shown in FIGS. 29B and 29C, the first and second right triangles 105a and 105b are respectively compared with enlarged patterns 106 and 107, which are acquired by enlarging the selected segmental block patterns BP(5) and BP(1). Based on the comparison results, the first and second right triangles 105a and 105b are modified to generate modified patterns 106 and 107 as shown in FIG. 29D. Segmental block pattern data 106a and 107a (see FIGS. 30A and 30B) of the modified patterns 106 and 107 are stored in the sixth data file 46. Pattern data 105ca (see FIG. 30C) of a rectangular pattern 105c located between the modified patterns 106 and 107 is stored as second pattern data in the fifth data file 45. When a rectangular pattern is segmented to two triangular patterns, only one of the triangular patterns may be modified to a segmental block pattern.

A process of modifying rectangular first pattern data to a trapezoidal segmental block pattern will now be discussed.

Figure 31:
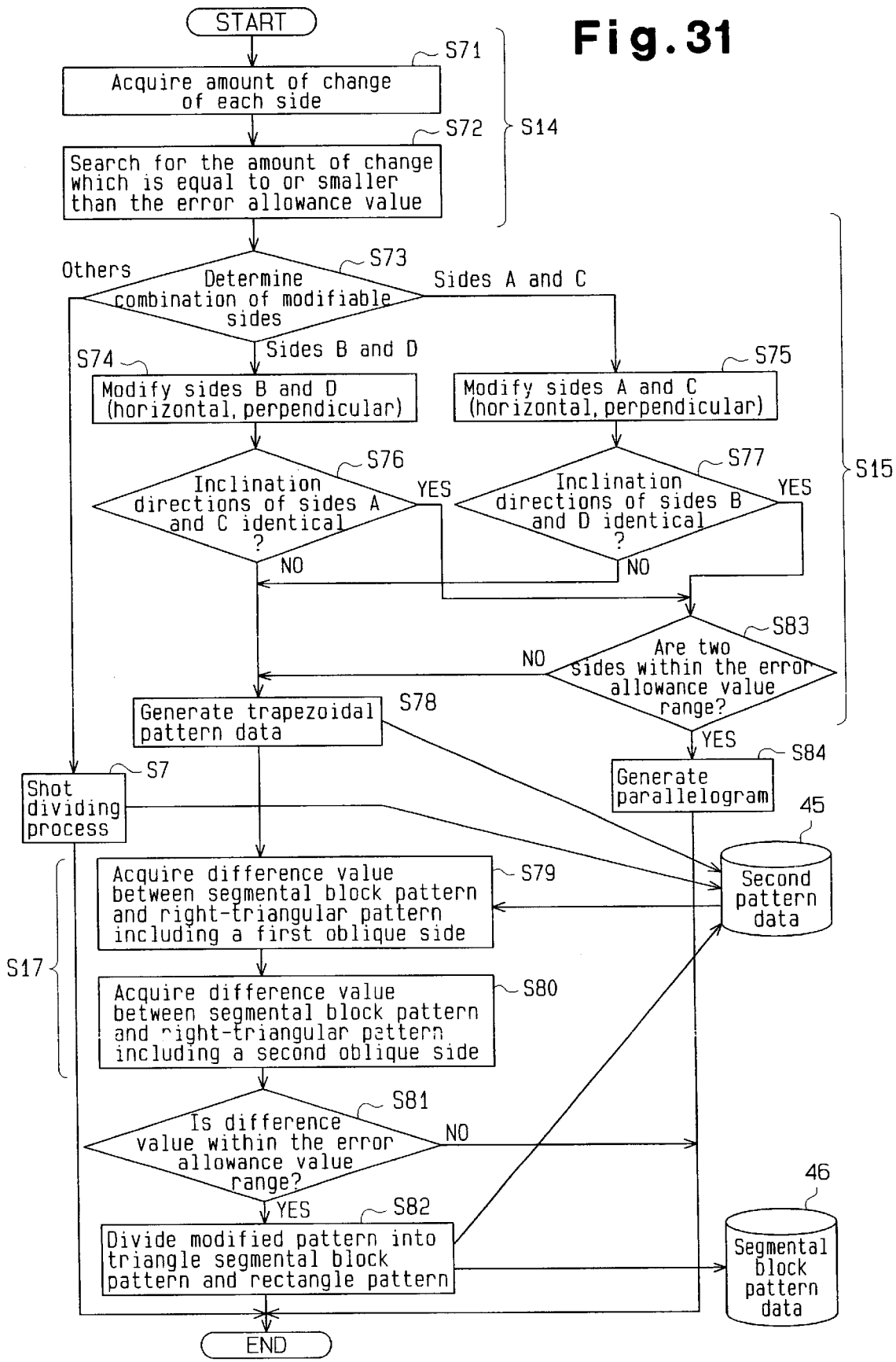
FIG. 31 is a flowchart of a third variation of a modification process for a rectangular pattern.

Steps S71 and S72 in FIG. 31 are substeps of step S14 (amount-of-change computing process) in FIG. 6, and respectively correspond to steps S31 and S32 in FIG. 21. Steps S73 to S77 and S83 are substeps of step S15 (first modification determination process) in FIG. 6. Steps S73 to S77 respectively correspond to steps S33 to S37 in FIG. 21. Steps S78 and S84 are substeps of step S16 (first modification process) in FIG. 6. Steps S79 and S80 are substeps of step S17 (difference value computing process) in FIG. 6. Steps S81 and S82 respectively correspond to steps S18 and S19 in FIG. 6.

(1) Process for Rectangular First Pattern Data Shown in FIG. 32A

In step S71, the CPU 32 acquires the amounts of change AΔx, AΔy, BΔx, BΔy, CΔx, CΔy, DΔx and DΔy of four sides A to D of a rectangular first pattern 111. In step S72, the CPU 32 determines if the amounts of change AΔy and CΔy for the sides A and C are within the error allowance value range.

As the amount of change AΔy of the side A and the amount of change CΔy of the side C are both within the error allowance value range in step S73, the first pattern 111 is determined as modifiable. Then, the CPU 32 modifies the side C to the side C1 lying horizontal to generate a second pattern 111a (see FIG. 32B) in step S75. In step S77, the CPU 32 then determines if the inclination directions of the sides B and D are identical. In this case, since the inclination directions of the sides B and D differ from each other, the second pattern 111a is determined as a trapezoid, and the trapezoidal second pattern 111a is generated in step S78. Data of the second pattern 111a is stored in the fifth data file 45.

Then, as shown in FIG. 32B, the CPU 32 generates a first right-triangular pattern 111b including the side B of the second pattern 111a and selects a segmental block pattern BP(7) with a block number "7" in FIG. 10, which approximates the first right-triangular pattern 111b, in step S79. As shown in FIG. 32C, the CPU 32 then enlarges the selected segmental block pattern BP(7) to the size of the first right-triangular pattern 111b, generating an enlarged pattern 112, and acquires a difference value BΔy2 between the enlarged pattern 112 and the first right-triangular pattern 111b.

Then, in step S80, the CPU 32 generates a second right-triangular pattern 111c including the side D of the second pattern 111a and selects a segmental block pattern BP(3) with a block number "3" in FIG. 10, which approximates the second right-triangular pattern 111c. Then, the CPU 32 enlarges the selected segmental block pattern BP(3) to the size of the second right-triangular pattern 111c, generating an enlarged pattern 113, and acquires a difference value DΔx2 between the enlarged pattern 113 and the second right-triangular pattern 111c.

When the CPU 32 determines in step S81 that the difference values BΔy2 and DΔx2 are within the error allowance value range, the CPU 32 proceeds to step S82. In step S82, the CPU 32 generates right-triangular segmental patterns 113 and 112 similar to the segmental block patterns BP(3) and BP(7), and converts the data format of those segmental patterns to the data format of segmental block patterns, generating segmental block pattern data 113a and 112a as shown in FIGS. 33A and 33B. Those segmental block pattern data 113a and 112a are stored in the sixth data file 46.

When the second pattern 111a is segmented in step S82, a rectangular pattern 111d remains. Data 111da (see FIG. 33C) of that rectangular pattern 111d is stored as second pattern data in the fifth data file 45.

Figure 34A:
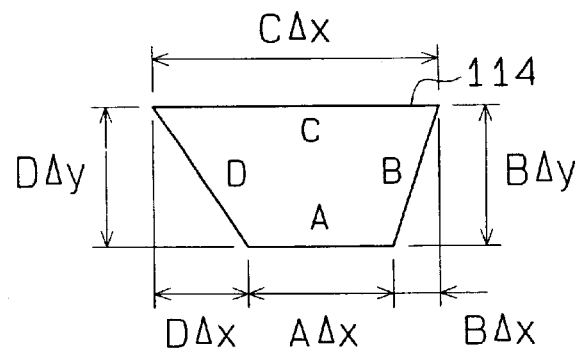
FIGS. 34A through 34C depict a modification process for a second example of a rectangular pattern in accordance with the flowchart of FIG. 31.
Figure 34B:
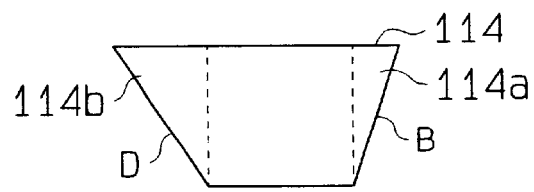
Figure 34C:

(2) Process for Rectangular First Pattern Data 114 Shown in FIG. 34A

In step S71, the CPU 32 acquires the amounts of change AΔx, AΔy, BΔx, BΔy, CΔx, CΔy, DΔx and DΔy of four sides A to D of the first pattern 114. This first pattern 114 is a trapezoid including mutually parallel sides A and C. After individual processes in steps S72, S73, S75, S77 and S78 are executed, the flow goes to step S79. In steps S79 and S80, first and second right-triangular patterns 114a and 114b including the sides B and D are generated. Here, it is assumed that there are no segmental block patterns which approximate the first and second right-triangular patterns 114a and 114b. In this case, the CPU 32 cannot acquire difference values for the individual sides of the first and second right-triangular patterns 114a and 114b. Therefore, the shape modification process ends at the determination process in step S81.

In this case, the exposure data generating apparatus supplies the data of the trapezoidal first pattern 114, stored in the data file 45, to the exposure apparatus. The exposure apparatus segments the first pattern 114 to a plurality of rectangular patterns and exposes the first pattern 114 by using data of those rectangular patterns.

Figure 35A:
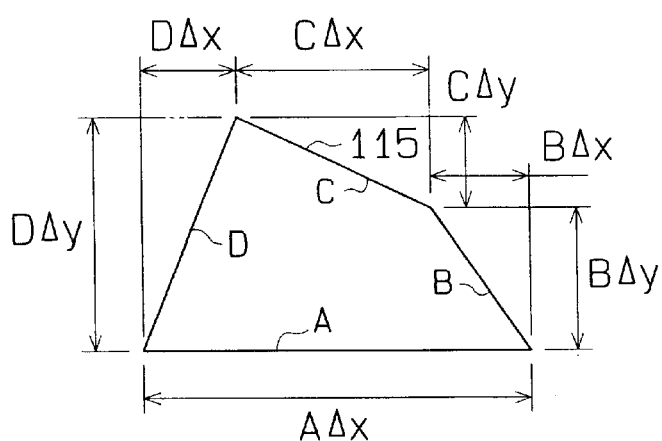
FIGS. 35A and 35B show a modification process for a third example of a rectangular pattern in accordance with the flowchart of FIG. 31.
Figure 35B:
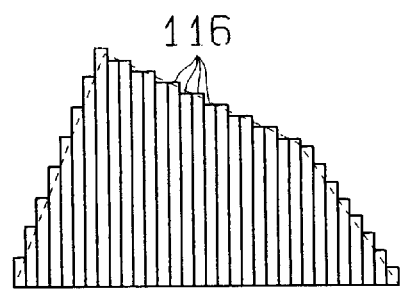

(3) Process for Rectangular First Pattern Data 115 Shown in FIG. 35A

In step S71, the CPU 32 acquires the amounts of change AΔx, AΔy, BΔx, BΔy, CΔx, CΔy, DΔx and DΔy of four sides A to D of the rectangular first pattern 115. Since only the amount of change AΔy for this first pattern 115 is within the error allowance value range, the first pattern 115 is determined as unmodifiable and the flow proceeds to step S7. In step S7, the first pattern 115 is subjected to shot segmentation to be segmented to a plurality of rectangular patterns 116. Data of those rectangular patterns 116 are stored as second pattern data in the fifth data file 45.

Figure 36:
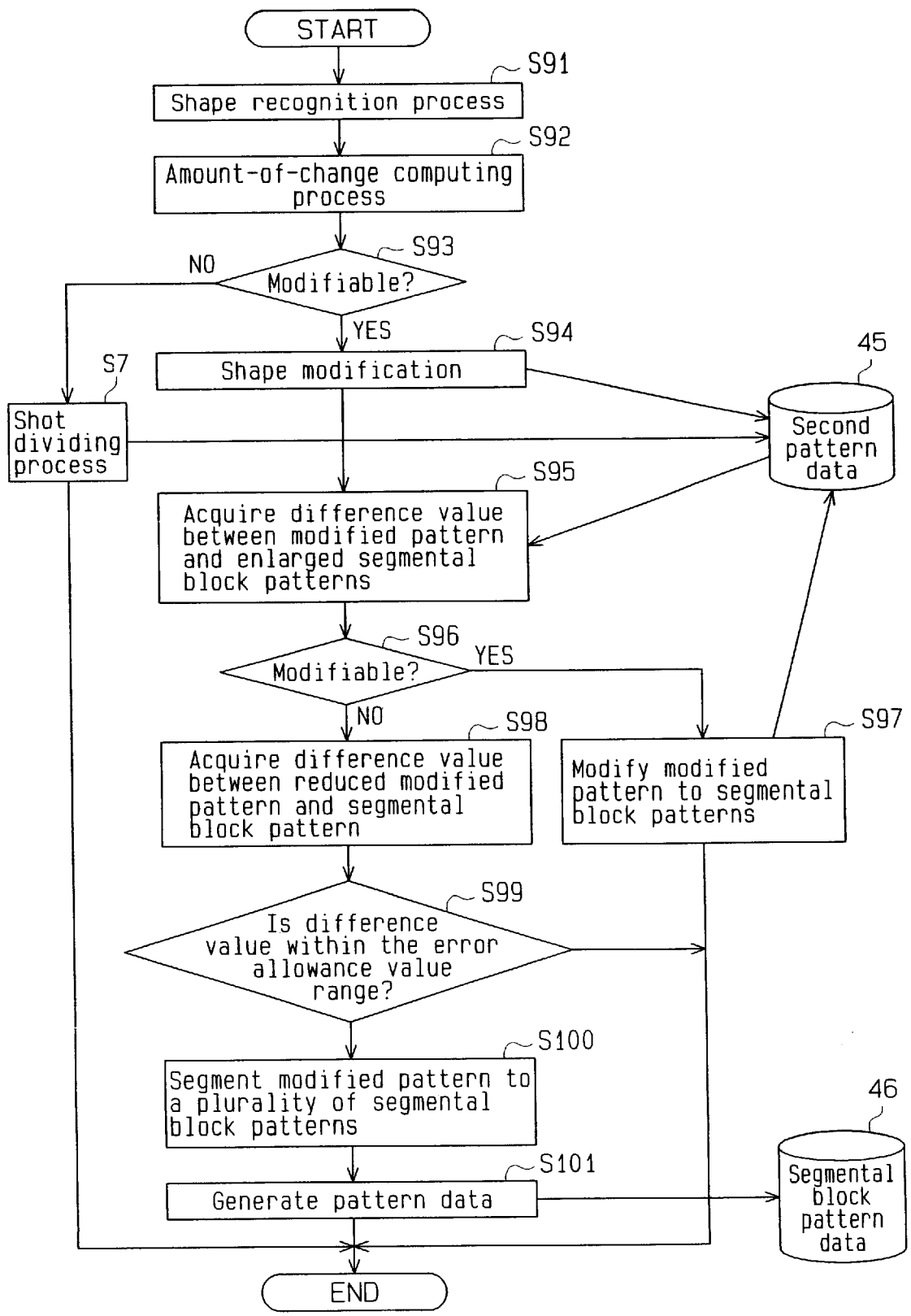
FIG. 36 is a flowchart of a first variation of a process of modifying a triangular or rectangular pattern using a plurality of segmental blocks.

A modification process using the segmental block patterns in the first case will now be discussed. Steps S91 to S94 in FIG. 36 respectively correspond to steps S12 and S14–S16 in FIG. 6. Steps S95 and S98 are substeps of step Si (difference value computing process) in FIG. 6. Steps S96 and S99 are substeps of step S18 (second modification determination process) in FIG. 6. Steps S97, S100 and S101 in FIG. 36 are substeps of step S19 (second modification process) in FIG. 6.

Figure 37A:
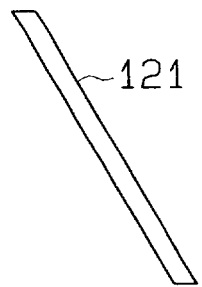
FIGS. 37A through 37D illustrate a modification process for a rectangular pattern in a first example according to the flowchart shown in FIG. 36.
Figure 37B:
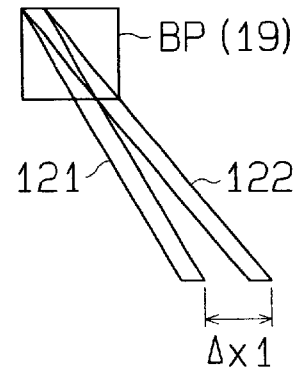

(1) Process for First Pattern Data 121 After the First Modification Process Shown in FIG. 37A The processes in steps S91–S95 generate the first pattern 121 which has undergone the first modification process. Those processes will now be discussed specifically. In step S91, the CPU 32 recognizes the shape of the original first pattern. When the recognition result indicates that the original first pattern is not rectangular, the CPU 32 computes the amount of change in step S92. In the next step S93, the CPU 32 determines based on the amount of change if the original first pattern is modifiable. When the original first pattern is determined as modifiable, the CPU 32 executes the first modification process in step S94, generating a modified first pattern 121.

Then, in step S95, the CPU 32 selects a segmental block pattern BP(19) with a block number "19" in FIG. 10, which approximates the first pattern 121, and enlarges the selected segmental block pattern BP(19), generating an enlarged pattern 122 in step S95. The CPU 32 then compares the enlarged pattern 122 with the first pattern 121 to acquire a first difference value Δx1. The CPU 32 then compares the first difference value Δx1 with the error allowance value in step S96. As the first difference value Δx1 is greater than the error allowance value at this time, the CPU 32 proceeds to step S98.

Figure 37C:
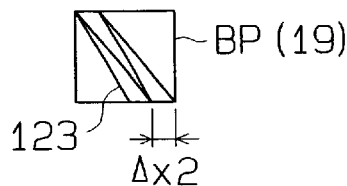

In step S98, the CPU 32 reduces the first pattern 121 to the size of the segmental block pattern BP(19), generating a reduced pattern 123, and acquires a second difference value Δx2 between the reduced pattern 123 and the segmental block pattern BP(19) as shown in FIG. 37C.

Figure 37D:
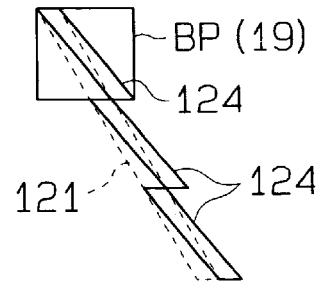
Figure 38:
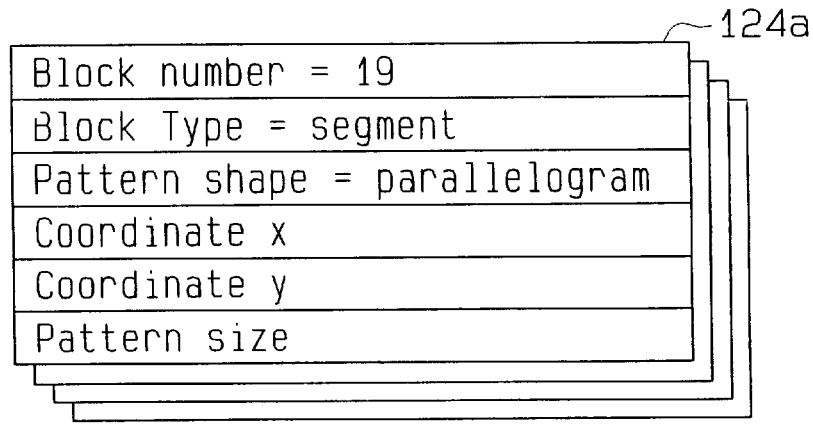
FIG. 38 shows the format of the pattern data in FIG. 37D.

In step S99, the CPU 32 compares the second difference value Δx2 with the error allowance value. As the second difference value Δx2 is within the error allowance value range, the CPU 32 segments the first pattern 121 to a plurality of patterns 124 of segmental blocks BP(19), as shown in FIG. 37D, generating segmental block pattern data 124a (see FIG. 38) for the patterns 124. The segmental block pattern data 124a is stored in the sixth data file 46.

Figure 39A:
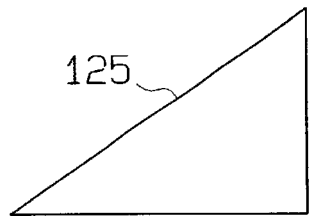
FIGS. 39A through 39D depict a modification process for a triangular pattern in a second example according to the flowchart of FIG. 36.
Figure 39B:
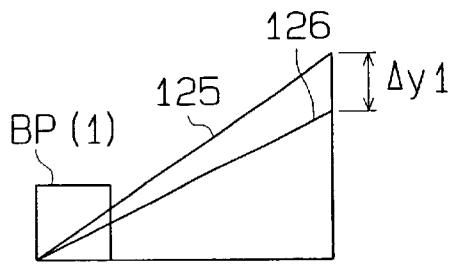
Figure 39C:
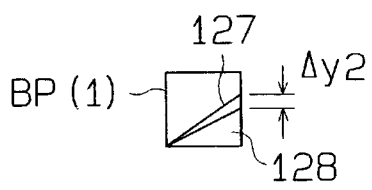

(2) Process for First Pattern Data 125 After the First Modification Process Shown in FIG. 39A Executing the processes in steps S91–S94 generates the first pattern 125. Then, in step S95, the CPU 32 selects a segmental block pattern BP(1) with a block number "1" in FIG. 10, which approximates the first pattern 125. Then, the CPU 32 enlarges the selected segmental block pattern BP(1), generating an enlarged pattern 126 and acquires a first difference value Δy1 between the enlarged pattern 126 and the first pattern 125, as shown in FIG. 39B. In the next step S96, the CPU 32 compares the first difference value Δy1 with the error allowance value. As the first difference value Δy1 exceeds the error allowance value, the CPU 32 reduces the first pattern 125 to the size of the segmental block pattern BP(1), generating a reduced pattern 127, and acquires a second difference value Δy2 between the fit reduced pattern 127 and the segmental block pattern BP(1) in step S98.

Figure 39D:
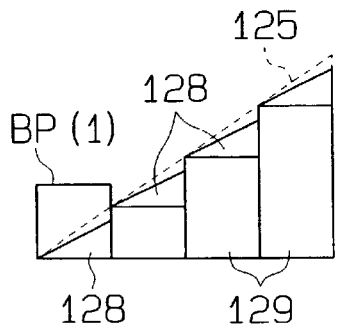
Figure 40A:
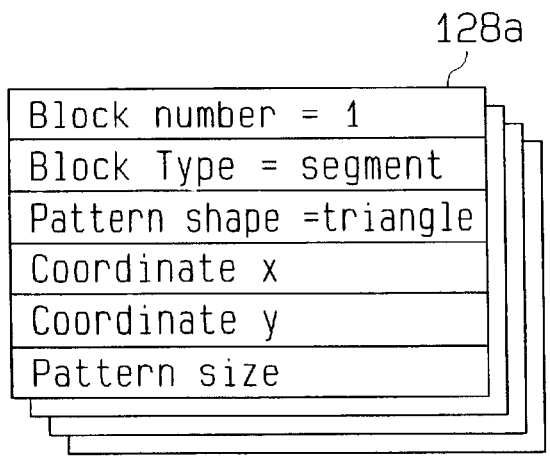
FIGS. 40A and 40B show the formats of the pattern data in FIG. 39D.
Figure 40B:
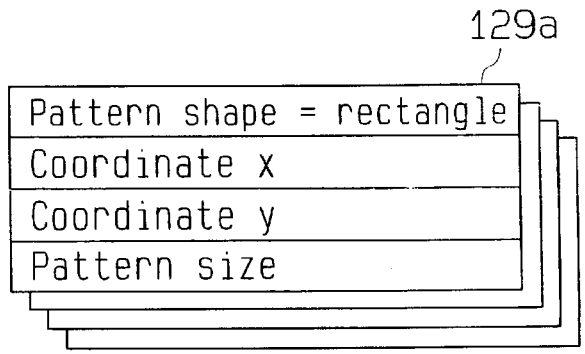

In step S99, the CPU 32 compares the second difference value Δy2 with the error allowance value. As the second difference value Δy2 is within the error allowance value range, the CPU 32 proceeds to step S100 to segment the first pattern 125 to segmental block patterns 128 and rectangular patterns 129 as shown in FIG. 39D. In step S101, the CPU 32 generates segmental block pattern data 128a (FIG. 40A) for the segmental block patterns 128 and pattern data 129a (FIG. 40B) for the rectangular patterns 129. The segmental block pattern data 128a is stored in the sixth data file 46, while the pattern data 129a is stored as second pattern data in the fifth data file 45.

Figure 41:
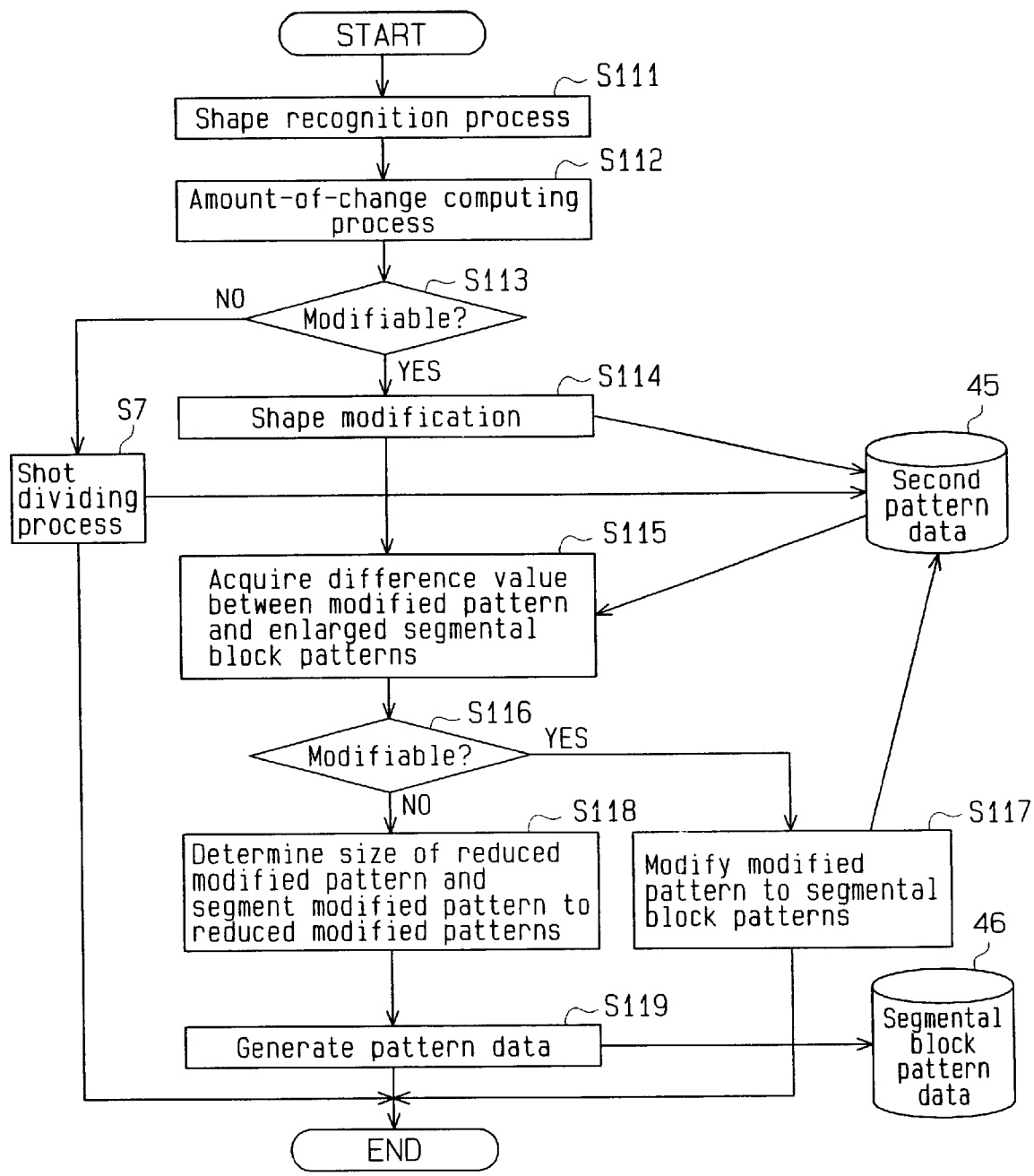
FIG. 41 is a flowchart of a second variation of a process of modifying a triangular or rectangular pattern using a plurality of segmental blocks.

A modification process using the segmental block patterns in the second case will now be discussed. Steps Sill to S116 in FIG. 41 respectively correspond to steps S91 to S96 in FIG. 36. Steps S117, S118 and S119 in FIG. 41 are substeps of step S19 (second modification process) in FIG. 6.

Figure 42A:
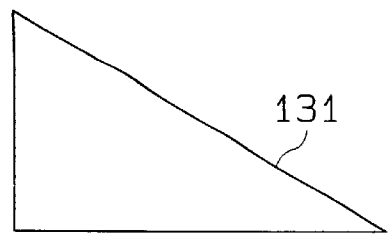
FIGS. 42A through 42C illustrate a modification process for a triangular pattern in a first example according to the flowchart shown in FIG. 41.
Figure 42B:
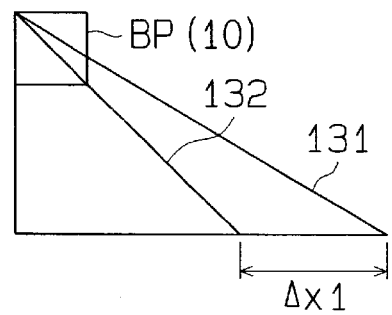

(1) Process for Triangular First Pattern Data 131 After the First Modification Process Shown in FIG. 42A Executing the processes in steps S110–S114 generates the first pattern 131 undergone the first modification process. Then, in step S115, the CPU 32 selects a segmental block pattern BP(10) with a block number "10" in FIG. 10, which approximates the first pattern 131, and enlarges the selected segmental block pattern BP(10), generating an enlarged pattern 132, as shown in FIG. 42B.

Figure 42C:
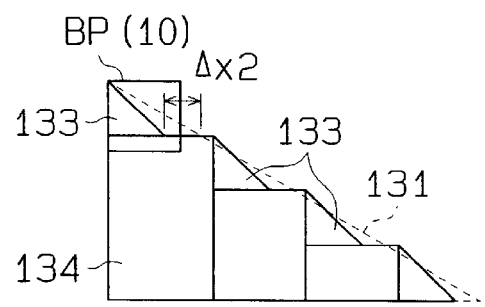
Figure 43A:
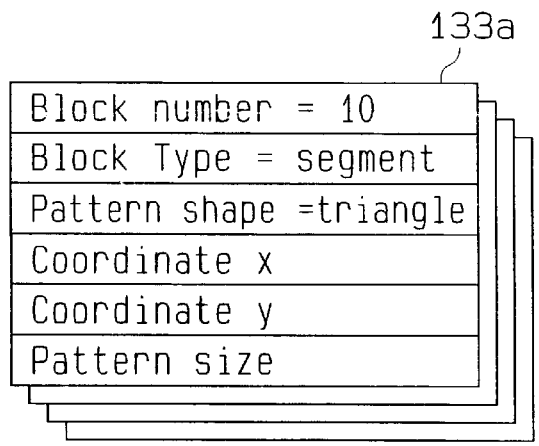
FIGS. 43A and 43B show the formats of the pattern data of FIG. 42C.
Figure 43B:
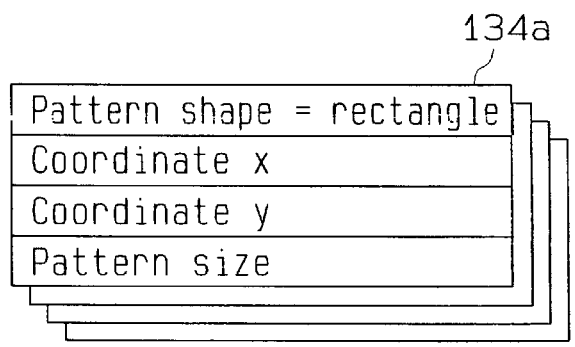

The CPU 32 compares the enlarged pattern 132 with the first pattern 131 to acquire a first difference value Δx1. In the next step S116, the CPU 32 compares the first difference value Δx1 with the error allowance value. As the first difference value Δx1 exceeds the error allowance value at this time, in step S118, the CPU 32 determines the size of segmental patterns 133 based on the segmental block pattern BP(10) such that a difference value Δx2 between the first pattern 131 and each segmental pattern 133 is within the error allowance value range, as shown in FIG. 42C. In this case, the segmental patterns 133 are reduced patterns of the segmental block pattern BP(10). The CPU 32 separates the first pattern 131 to the size-determined patterns 133 and rectangular patterns 134. In step S119, the CPU 32 generates segmental block pattern data 133a (see FIG. 43A) for the segmental patterns 133 and pattern data 134a (see FIG. 43B) for the rectangular patterns 134. The segmental block pattern data 133a is stored in the sixth data file 46, and the pattern data 134a is stored as the second pattern data in the fifth data file 45.

Figure 44A:
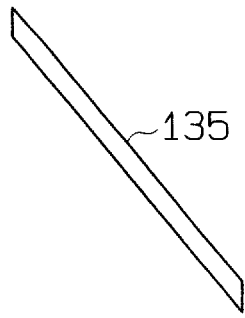
FIGS. 44A through 44D depict a modification process for a rectangular pattern in a second example according to the flowchart shown in FIG. 41.
Figure 44B:
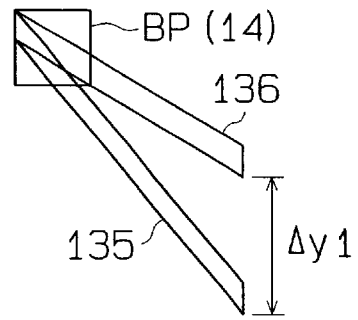
Figure 44C:
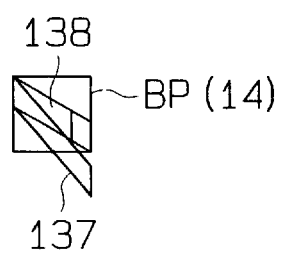
Figure 44D:
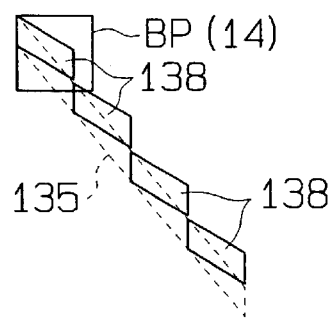
Figure 45:
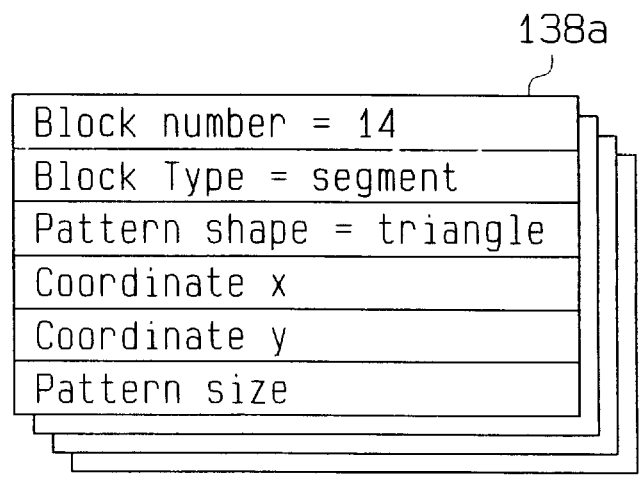
FIG. 45 shows the format of the pattern data in FIG. 44D.
Figures 46A, 46B, 46C, 46D:
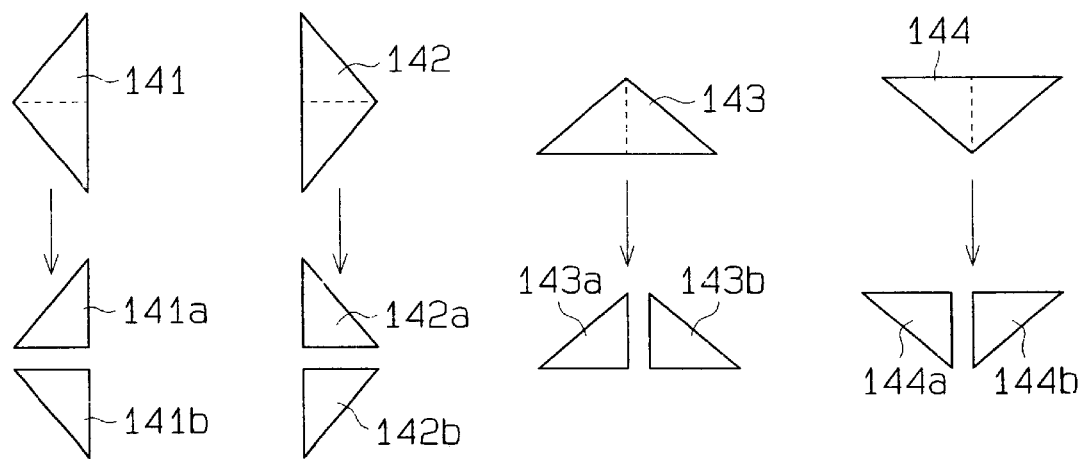
FIG. 46 illustrates a modification process involving segmentation of a triangular pattern into a plurality of triangular patterns.

(2) Process for Rectangular Pattern Data After the First Modification Process Shown in FIG. 44A Executing the processes in steps S111–S114 generates the first pattern 135 undergone the first modification process. Then, in step S115, the CPU 32 selects a segmental block pattern BP(14) with a block number "14" in FIG. 10, which approximates the first pattern 135, and enlarges the selected segmental block pattern BP(14), generating an enlarged pattern 136. The CPU 32 then acquires a first difference value Δy1 between the enlarged pattern 136 and the first pattern 135. In step S116, the CPU 32 compares the first difference value Δy1 with the error allowance value. As the first difference value Δy1 is greater than the error allowance value, the CPU 32 proceeds to step S118 and reduces the first pattern 135 to the size of the segmental block pattern BP(14), generating a reduced pattern 137. For this reduced pattern 137, the difference value also exceeds the error allowance value, so that the CPU 32 determines the first pattern 135 as unmodifiable. In this case, in step S118, the CPU 32 determines the size of reduced patterns 138 based on the segmental block pattern BP(14) such that a difference value between the first pattern 135 and each reduced pattern 138 is within the error allowance value range, as shown in FIG. 44C. The CPU 32 separates the first pattern 135 into a plurality of reduced patterns 138. In the next step S119, the CPU 32 generates segmental block pattern data 138a for those reduced go segmental patterns 138. The reduced segmental block pattern data 138a is stored in the sixth data file 46.

It should be apparent to those skilled in the art that the present invention may be embodied in many other specific forms without departing from the spirit or scope of the invention. Particularly, it should be understood that the invention may be embodied in the following forms.

After segmentation of a triangular pattern to a plurality of right-triangular patterns, it may be determined if the plural right-triangular patterns are modifiable. When triangular patterns 141 to 144 shown in FIGS. 46A to 46D are determined as unmodifiable, for example, each of the triangular patterns 141–144 is segmented to right-triangular patterns 141a and 141b, 142a and 142b, 143a and 143b, or 144a and 144b. The amount of exposure data and the exposure time are reduced by modifying those right-triangular patterns 141a–144b to segmental block patterns. The triangular first pattern 83 in FIG. 18A may be separated into a triangular pattern including the side A and a right-triangular pattern including the side B. In this case, the right-triangular pattern can be modified to segmental block patterns.

This invention may be adapted to a case where a pattern is exposed on a substrate which is used for a display device, such as an Liquid Crystal Display (LCD) or Plasma Display Panel (PDP).

Therefore, the present examples and embodiments are to be considered as illustrative and not restrictive and the invention is not to be limited to the details given herein, but may be modified within the scope and equivalence of the appended claims.

What is claimed is:

1. A method of generating exposure data to expose a layout pattern of a semiconductor integrated circuit on a medium using a mask having a plurality of segmental block patterns of predetermined shapes, the method comprising:

determining whether the layout pattern may be modified to one or more predetermined exposable patterns, including at least one of triangular, parallelogram and trapezoidal patterns, without segmenting the layout pattern into a plurality of rectangular patterns;

modifying the layout pattern to the one or more predetermined exposable patterns when modification of the layout pattern is possible;

determining whether said modified one or more predetermined exposable patterns may be modified to segmental block patterns;

modifying said modified one or more predetermined exposable patterns to the segmental block patterns when modification of said one or more predetermined exposable patterns is determined as being possible; and generating exposure data using said modified segmental block patterns.

2. The method of claim 1, wherein, determining whether the layout pattern may be modified comprises:

computing an amount of change of a layout pattern when the layout pattern is modified to one or more predetermined exposable patterns; and comparing the amount of change with a predetermined error allowance value.

3. The method of claim 1, wherein determining whether said modified one or more predetermined exposable patterns may be modified comprises:

enlarging or reducing segmental block patterns such that a size of the segmental block patterns corresponds to a size of a modified one or more predetermined exposable patterns;

comparing the enlarged or reduced segmental block patterns with the modified one or more predetermined exposable patterns to compute a difference value between the enlarged or reduced segmental block patterns and the modified one or more predetermined exposable patterns; and comparing the difference value with a predetermined error allowance value.

4. The method of claim 3, wherein said modifying said modified one or more predetermined exposable patterns comprises changing the modified one or more predetermined exposable patterns to enlarge or reduce segmental block patterns.

5. The method of claim 1, wherein the layout pattern includes triangular patterns, the one or more predetermined exposable patterns include exposable right-triangular patterns, and the segmental block patterns include right-triangular segmental block pattterns.

6. The method of claim 1, wherein the layout pattern includes rectangular patterns, the one or more predetermined exposable patterns include exposable parallelogram patterns, and the segmental block patterns include parallelogram segmental block patterns.

7. The method of claim 1, wherein the layout pattern includes rectangular patterns, the one or more predetermined exposable patterns include exposable parallelogram patterns, and the segmental block patterns include right-triangular segmental block patterns;

wherein determining whether the layout pattern may be modified includes determining whether a rectangular layout pattern is modifiable to a parallelogram exposable pattern; and wherein determining whether said modified one or more predetermined exposable patterns may be modified includes determining whether a modified parallelogram exposable pattern is separable into a plurality of patterns including a combination of a plurality of right-triangular segmental block patterns.

8. The method of claim 1, wherein the layout pattern includes rectangular patterns, the one or more predetermined exposable patterns include exposable trapezoidal patterns, and the segmental block patterns include right-triangular segmental block patterns;

wherein determining whether the layout pattern may be modified includes determining whether a rectangular layout pattern is modifiable to a trapezoidal exposable pattern; and wherein determining whether said modified one or more predetermined exposable patterns may be modified includes determining whether a modified trapezoidal exposable pattern is modifiable to a combination of a plurality of right-triangular segmental block patterns.

9. The method of claim 1, wherein determining whether said modified one or more predetermined exposable patterns may be modified comprises:

reducing the modified one or more predetermined exposable patterns to a size of segmental block patterns to generate reduced patterns, when modification of one or more predetermined exposable patterns is determined as being impossible;

determining whether the reduced patterns are similar to segmental block patterns; and segmenting the modified one or more predetermined exposable patterns to a plurality of patterns including a plurality of said segmental block patterns.

10. The method of claim 1, wherein determining whether said modified one or more predetermined exposable patterns may be modified comprises:

generating reduced patterns when modification of one or more predetermined exposable patterns is determined as being impossible, wherein sizes of the reduced patterns are determined such that a value of a difference between the modified one or more predetermined exposable patterns and segmental block patterns is within an error allowance value range; and segmenting the modified one or more predetermined exposable patterns to a plurality of patterns including a plurality of said reduced patterns.

11. An exposure data generating apparatus to expose a layout pattern of a semiconductor integrated circuit on a medium using a mask having a plurality of segmental block patterns of predetermined shapes, the apparatus comprising:

a memory unit having a segmental block pattern data file and a first pattern data file in which layout pattern data is stored; and a processing unit, connected to the memory unit, that receives the layout pattern data from the first pattern data file and processes the layout pattern data to generate exposure data, wherein the processing unit includes a first determining circuit that determines whether the layout pattern can be modified to one or more predetermined exposable patterns including at least one of triangular, parallelogram and trapezoidal patterns without segmenting the layout pattern into a plurality of rectangular patterns;

a modifying circuit that modifies the layout pattern to the one or more predetermined exposable patterns when modification is determined as being possible in the first determining circuit;

a second determining circuit that determines whether the modified one or more predetermined exposable patterns can be modified to segmental block patterns;

a second modifying circuit that modifies the modified one or more predetermined exposable patterns to the segmental block patterns when modification is determined as being possible in the second determining circuit; and a generating circuit that generates exposure data using the modified segmental block patterns.

12. The apparatus of claim 11, wherein the first determining circuit includes:

a computing circuit that computes an amount of change of a layout pattern when the layout pattern is modified to one or more predetermined exposable patterns; and a comparing circuit that compares the amount of change with a predetermined error allowance value.

13. The apparatus of claim 11, wherein the second determining circuit includes:

an adjusting circuit that enlarges or reduces segmental block patterns such that a size of the segmental block patterns corresponds to a size of a modified one or more predetermined exposable patterns;

a comparing circuit that compares the enlarged or reduced segmental block patterns with the modified one or more predetermined exposable patterns to compute a difference value representing a difference between the enlarged or reduced segmental block patterns and the modified one or more predetermined exposable patterns; and a second comparison circuit that compares the difference value with a predetermined error allowance value.

14. The apparatus of claim 13, wherein the second modifying circuit includes a changing circuit that changes the modified one or more predetermined exposable patterns to enlarge or reduce segmental block patterns.

15. The apparatus of claim 11, wherein the layout pattern includes triangular patterns, the one or more predetermined exposable patterns include exposable right-triangular patterns, and the segmental block patterns include right-tirangular segmental block patterns.

16. The apparatus of claim 11, wherein the layout pattern includes rectangular patterns, the one or more predetermined exposable patterns include exposable parallelogram patterns, and the segmental block patterns include parallelogram segmental block patterns.

17. The apparatus of claim 11, wherein the layout pattern includes rectangular patterns, the one or more predetermined exposable patterns include exposable parallelogram patterns, and the segmental block patterns include right-triangular segmental block patterns; and the first determining circuit determines whether a rectangular layout pattern is modifiable to a parallelogram exposable pattern, and the second determining circuit determines whether a modified parallelogram exposable pattern is separable into a plurality of patterns including a combination of a plurality of right-triangular segmental block patterns.

18. The apparatus of claim 11, wherein the layout pattern includes rectangular patterns, the one or more predetermined exposable patterns include exposable trapezoidal patterns, and the segmental block patterns include right-triangular segmental block patterns; and the first determining circuit determines whether a rectangular layout pattern is modifiable to a trapezoidal exposable pattern, and the second determining circuit determines whether a modified trapezoidal exposable pattern is modifiable to a combination of a plurality of right triangular segmental block patterns.

19. The apparatus of claim 11, wherein the second modifying circuit includes:

a reducing circuit that reduces the modified one or more predetermined exposable patterns to a size of segmental block patterns to generate reduced patterns, when modification is determined as being impossible in the second determining circuit;

a determining circuit that determines whether the reduced patterns are similar to segmental block patterns; and a segmenting circuit that segments the modified one or more predetermined exposable patterns to a plurality of patterns including a plurality of segmental block patterns.

20. The apparatus of claim 11, wherein the second modifying circuit includes:

a generating circuit that generates reduced patterns when modification is determined as impossible by the second determining means, wherein sizes of the reduced patterns are determined such that a value of a difference between the modified one or more predetermined exposable patterns and segmental block patterns is within an error allowance value range; and a segmenting circuit that segments the modified one or more predetermined exposable patterns to a plurality of patterns including a plurality of reduced patterns.

21. A computer readable recording medium having a method recorded thereon to control a computer to generate exposure data for exposing a layout pattern of a semiconductor integrated circuit on a target medium using a mask having a plurality of segmental block patterns of predetermined shapes, the method comprising:

determining whether the layout pattern can be modified to one or more predetermined exposable patterns, including at least one of triangular, parallelogram and trapezoidal patterns, without segmenting the layout pattern into a plurality of rectangular patterns;

modifying the layout pattern to one or more predetermined exposable patterns when modification is determined as possible in the first determining section;

determining whether the modified one or more predetermined exposable patterns can be modified to segmental block patterns;

modifying the modified one or more predetermined exposable patterns to the segmental block patterns when modification is determined as possible in the determining whether the modified one or more predetermined exposable patterns can be modified to segmental block patterns; and generating exposure data using the modified segmental block patterns.

22. The recording medium of claim 21, wherein the determining whether the layout pattern can be modified to one or more predetermined exposable patterns includes:

computing an amount of change of a layout pattern when the layout pattern is modified to one or more predetermined exposable patterns; and comparing the amount of change with a predetermined error allowance value.

23. The recording medium of claim 21, wherein the determining whether the modified one or more predetermined exposable patterns can be modified to segmental block patterns includes:

enlarging or reducing segmental block patterns such that a size of the segmental block patterns corresponds to a size of the modified one or more predetermined exposable patterns;

comparing the enlarged or reduced segmental block patterns with the modified one or more predetermined exposable patterns to compute a difference value representing a difference between the enlarged or reduced segmental block patterns and the modified one or more predetermined exposable patterns; and comparing the difference value with a predetermined error allowance value.

24. The recording medium of claim 23, wherein the modifying the modified one or more predetermined exposable patterns to the segmental block patterns when modification is determined as possible includes changing the modified one or more predetermined exposable patterns to enlarged or reduced segmental block patterns.

25. The recording medium of claim 21, wherein the layout pattern includes triangular patterns, the one or more predetermined exposable patterns include exposable right-triangular patterns, and the segmental block patterns include right-triangular segmental block patterns.

26. The recording medium of claim 21, wherein the layout pattern includes rectangular patterns, the one or more predetermined exposable patterns include exposable parallelogram patterns, and the segmental block patterns include parallelogram segmental block patterns.

27. The recording medium of claim 21, wherein the layout pattern includes rectangular patterns, the one or more predetermined exposable patterns include exposable parallelogram patterns, and the segmental block patterns include right-triangular segmental block patterns;

the determining whether the layout pattern can be modified to one or more predetermined exposable patterns, determines whether a rectangular layout pattern is modifiable to a parallelogram exposable pattern; and the determining whether the modified one or more predetermined exposable patterns can be modified to segmental block patterns, determines whether a modified parallelogram exposable pattern is separable into a plurality of patterns including a combination of a plurality of right-triangular segmental block patterns.

28. The recording medium of claim 21, wherein the layout pattern includes rectangular patterns, the one or more predetermined exposable patterns include exposable trapezoidal patterns, and the segmental block patterns include right-triangular segmental block patterns; and the determining whether the layout pattern can be modified to one or more predetermined exposable patterns, determines whether a rectangular layout pattern is modifiable to a trapezoidal exposable pattern; and the determining whether the modified one or more predetermined exposable patterns can be modified to segmental block patterns, determines whether a modified trapezoidal exposable pattern is modifiable to a combination of a plurality of right-triangular segmental block patterns.

29. The recording medium of claim 21, wherein the modifying the modified one or more predetermined exposable patterns to the segmental block patterns when modification is determined as possible includes:

reducing the modified one or more predetermined exposable patterns to a size of segmental block patterns to generate reduced patterns, when modification is determined as impossible in the second determining circuit;

determining whether the reduced patterns are similar to segmental block patterns; and segmenting the modified one or more predetermined exposable patterns to a plurality of patterns including a plurality of segmental block patterns.

30. The recording medium of claim 21, wherein the modifying the modified one or more predetermined exposable patterns to the segmental block patterns when modification is determined as possible includes:

generating reduced patterns when modification is determined as impossible in the determining whether the modified one or more predetermined exposable patterns can be modified to segmental block patterns, wherein sizes of the reduced patterns are determined such that a value of a difference between the modified one or more predetermined exposable patterns and segmental block patterns is within an error allowance value range; and segmenting the modified one or more predetermined exposable patterns to a plurality of patterns including a plurality of reduced patterns.

31. An exposure data generating apparatus to expose a layout pattern of a semiconductor integrated circuit on a medium using a mask having a plurality of segmental block patterns of predetermined shapes, the apparatus comprising:

a processing unit, to process layout pattern data and generate exposure data, wherein the processing unit includes a first determining unit to determine whether the layout pattern can be modified to one or more predetermined exposable patterns, including at least one of triangular, parallelogram and trapezoidal patterns, without segmenting the layout pattern into a plurality of rectangular patterns;

a first modifying unit to modify the layout pattern to the one or more predetermined exposable patterns when modification is determined as being possible in the first determining unit;

a second determining unit to determine whether the modified one or more predetermined exposable patterns can be modified to segmental block patterns; and a second modifying unit to modify the modified one or more predetermined exposable patterns to the segmental block patterns when modification is determined as being possible in the second determining unit, wherein the exposure data is generated using the modified segmental block patterns.

* * * * *